US005928768A

United States Patent [19]
Ikeda et al.

[11] Patent Number: 5,928,768
[45] Date of Patent: Jul. 27, 1999

[54] SILICON NITRIDE CIRCUIT BOARD

[75] Inventors: Kazuo Ikeda; Hiroshi Komorita; Yoshitoshi Sato; Michiyasu Komatsu; Nobuyuki Mizunoya, all of Yokohama, Japan

[73] Assignee: Kabushiki Kaisha Toshiba, Kawasaki, Japan

[21] Appl. No.: 08/666,467

[22] PCT Filed: Mar. 19, 1996

[86] PCT No.: PCT/JP96/00723

§ 371 Date: Sep. 4, 1996

§ 102(e) Date: Sep. 4, 1996

[87] PCT Pub. No.: WO96/29736

PCT Pub. Date: Sep. 26, 1996

[30] Foreign Application Priority Data

| Mar. 20, 1995 | [JP] | Japan | 7-061264 |
| Mar. 20, 1995 | [JP] | Japan | 7-061265 |
| Jun. 23, 1995 | [JP] | Japan | 7-158205 |
| Jun. 23, 1995 | [JP] | Japan | 7-158207 |
| Jun. 23, 1995 | [JP] | Japan | 7-158208 |
| Aug. 21, 1995 | [JP] | Japan | 7-211881 |

[51] Int. Cl.$^6$ ........................................ B32B 9/00
[52] U.S. Cl. ............................... 428/210; 428/209
[58] Field of Search .................... 428/210, 209, 428/901; 174/258; 361/739

[56] References Cited

U.S. PATENT DOCUMENTS

| 4,563,383 | 1/1986 | Kuneman et al. | 428/216 |
| 4,608,354 | 8/1986 | Avella et al. | 501/97 |
| 4,659,611 | 4/1987 | Iwase et al. | 428/209 |
| 4,716,133 | 12/1987 | Horiuchi et al. | 501/97 |
| 4,746,636 | 5/1988 | Yokoyama | 501/97 |

(List continued on next page.)

FOREIGN PATENT DOCUMENTS

| 25 36 624 | 3/1976 | Germany . |
| 37 28 096 | 1/1989 | Germany . |
| 93 20 574 | 11/1994 | Germany . |
| 3-218975 | 9/1991 | Japan . |
| 6-183864 | 7/1994 | Japan . |
| 6-216481 | 8/1994 | Japan . |

OTHER PUBLICATIONS

Journal of the American Ceramic Society, vol. 79, No. 11, pp. 2878–2882, Nov. 1996, N. Hirosaki et al., "Thermal Conductivity of Gas–Pressure–Sintered Silicon Nitride".

Primary Examiner—William Krynski
Assistant Examiner—Cathy F. Lam
Attorney, Agent, or Firm—Oblon, Spivak, McClelland, Maier & Neustadt, P.C.

[57] ABSTRACT

This invention provides a silicon nitride circuit board in which a metal circuit plate is bonded to a high thermal conductive silicon nitride substrate having a thermal conductivity of not less than 60 W/m K, wherein a thickness $D_s$ of the high thermal conductive silicon nitride substrate and a thickness $D_M$ of the metal circuit plate satisfy a relational formula $D_s \leq 2D_M$. The silicon nitride circuit board is characterized in that, when a load acts on the central portion of the circuit board which is held at a support interval of 50 mm, a maximum deflection is not less than 0.6 mm until the silicon nitride substrate is broken. The silicon nitride circuit board is characterized in that, when an anti-breaking test is performed to the circuit board which is held at a support interval of 50 mm, an anti-breaking strength is not less than 500 MPa. The metal circuit plate or a circuit layer are integrally bonded on the silicon nitride substrate by a direct bonding method, an active metal brazing method, or an metalize method. According to the silicon nitride circuit board with the above arrangement, high thermal conductivity and excellent heat radiation characteristics can be obtained, and heat cycle resistance characteristics can be considerably improved.

5 Claims, 10 Drawing Sheets

U.S. PATENT DOCUMENTS

| | | | |
|---|---|---|---|
| 4,806,510 | 2/1989 | Kanai et al. | 501/97 |
| 4,883,704 | 11/1989 | Sato et al. | 428/209 |
| 4,892,848 | 1/1990 | Yoshida et al. | 264/65 |
| 4,920,085 | 4/1990 | Yoshida et al. | 501/97 |
| 5,017,530 | 5/1991 | Arakawa et al. | 501/98 |
| 5,034,357 | 7/1991 | Yamakawa et al. | 501/96 |
| 5,063,121 | 11/1991 | Sato et al. | 428/698 |
| 5,085,923 | 2/1992 | Yamakawa et al. | 428/209 |
| 5,439,856 | 8/1995 | Komatsu | 501/97 |
| 5,508,240 | 4/1996 | Komatsu et al. | 501/96 |

SILICON NITRIDE CIRCUIT BOARD

TECHNICAL FIELD

The present invention relates to a silicon nitride circuit board used in a semiconductor device or the like, and more particularly, to a silicon nitride circuit board whose heat radiation characteristics and mechanical strength are simultaneously improved and whose heat cycle resistance characteristics are improved.

In the present invention, a high-strength silicon nitride substrate having a thermal conductivity (heat conductivity) of 60 W/m K or more is used to improve a circuit board, thereby making it possible to form a thin circuit board. When the circuit board is decreased in thickness, a compact, high-accurate circuit board is obtained, and a decrease in source cost or material cost can be decreased. The maximum deflection and anti-breaking strength of the circuit board are considerably improved in comparison with a conventional circuit board. For this reason, the circuit board is not easily broken when the circuit board is incorporated or assembled in a semiconductor device or the like, and the production yield of the semiconductor device can be considerably improved. When the silicon nitride substrate having high strength, excellent heat radiation, and high thermal conductivity is applied, a high-heat-quantity type and wide-area type circuit board (for example MCM: multi-chip module) in which a plurality of semiconductor elements or chips can be mounted can also be manufactured.

BACKGROUND ART

A circuit board in which a metal circuit layer having electrical conductivity is integrally bonded to the surface of a ceramic substrate such as an alumina ($Al_2O_3$) sintered body having excellent insulating characteristics with a soldering material, and a semiconductor element is mounted at a predetermined position of the metal circuit layer is popularly used.

A ceramic sintered body containing silicon nitride as a main component has excellent heat resistance in a high-temperature environment of 1000° C. or more, and has excellent thermal-shock resistance. For this reason, as a structural material for high temperature which can be replaced with a conventional heat resistant super alloy, the ceramic sintered body is tried to be applied to various refractory heat-resistant parts such as gas turbine parts, engine parts, or mechanical parts for making steel. In addition, since the ceramic sintered body has high corrosion resistance to a metal, the ceramics sintered body is tried to be applied as a melt-resisting material for a molten metal. Since the ceramic sintered body has high abrasion resistance, the ceramic sintered body is tried to be actually applied to a slidable member such as a bearing or a cutting tool.

As the composition of a conventional silicon nitride ceramic sintered body, the following is known. That is, an oxide of a rare earth element or alkaline earth element such as yttrium oxide ($Y_2O_3$), cerium oxide (CeO), or calcium oxide (CaO) is added as a sintering assistant to silicon nitride material powder. By using such a sintering assistant, sintering characteristics are improved, and high density and high strength can be obtained.

A conventional silicon nitride sintered body is manufactured as follows. That is, a silicon nitride source powder is added with the above sintering assistant to be molded. The molded member is sintered in a sintering furnace at a temperature of about 1,600° C. to 2,000° C. for a predetermined time, and then cooled in the furnace. The resultant sintered body is subjected to grinding and polishing processes.

However, in a silicon nitride sintered body manufactured by the above conventional method, although mechanical strength such as a toughness or tenacity value is excellent, thermal conductivity characteristics are considerably degraded in comparison with other sintered bodies such as an aluminum nitride (AlN) sintered body, a beryllium oxide (BeO) sintered body, and a silicon carbide (SiC) sintered body. For this reason, the silicon nitride sintered body is not actually used as a material for electronics such as a semiconductor circuit board whose heat radiation characteristics are required, and the application range of the silicon nitride sintered body is disadvantageously narrow.

Since an aluminum nitride (AlN) sintered body has a high thermal conductivity and a low heat expansion coefficient in comparison with other ceramic sintered bodies, the aluminum nitride sintered body is popularly used as circuit board parts or packaging materials for mounting a semiconductor element (chip) whose high speed, high output, multi-function, and increase in size are developed. However, an AlN sintered body having sufficient mechanical strength cannot be obtained. For this reason, damage occurs in the step of packaging a circuit board, and the packaging step becomes cumbersome, thereby degrading the manufacturing efficiency of a semiconductor device.

More specifically, when a circuit board having a ceramic substrate such as the aluminum nitride sintered body or an aluminum oxide sintered body as a main constituent material is to be fixed to a packaging board with screws or the like in the assembly step, a circuit board is damaged by slight deformation caused by the pressing force of the screws or shock in handling, the production yield of a semiconductor device may considerably decrease.

For this reason, a large circuit board having a large substrate area is not easily formed. In assembling a semiconductor device, a large number of circuit boards are respectively incorporated in the device main body in accordance with the number of required functions. For this reason, the packaging step becomes cumbersome, and the manufacturing efficiency of the semiconductor device degraded.

Therefore, a circuit board having high-strength characteristics resistant to external force, high-toughness or tenacity characteristics, high output, and excellent heat radiation characteristics coping with high heat generation is demanded.

In a circuit board formed such that a metal circuit layer and heat-generating parts such as semiconductor elements are integrally bonded to each other on the surface of an aluminum nitride substrate, the mechanical strength and toughness of the aluminum nitride substrate itself are insufficient. For this reason, the circuit board receives a repetitive heat cycle, and cracks are easily formed in the aluminum nitride substrate near the bonding portion of the metal circuit layer. Therefore, heat cycle resistance characteristics and reliability are degraded.

In a case wherein a circuit board is manufactured by using a ceramic substrate such as aluminum nitride having high thermal conductivity, in order to assure a certain strength value and high dielectric strength, an aluminum nitride substrate having a large thickness must be used. For this reason, regardless of the high thermal conductivity of the AlN substrate, the heat resistance value of the overall circuit board increases. Therefore, heat radiation which is in proportion to the thermal conductivity cannot be obtained.

The present invention has been made to cope with the above demands, and has as its object to provide a silicon nitride circuit board which uses high-strength and high-toughness characteristics which are original characteristics of a silicon nitride sintered body, and which has a high thermal conductivity, excellent heat radiation characteristics, and considerably improved heat cycle resistance characteristics.

It is another object of the present invention to provide a silicon nitride circuit board which has a high thermal conductivity, excellent heat radiation characteristics, and considerably improved heat cycle resistance characteristics, and in which assembling or packaging characteristics to a semiconductor device in the assembly step are improved.

DISCLOSURE OF THE INVENTION

In order to achieve the above object, the present inventor investigated a substrate material which satisfied strength and a toughness or tenacity value without degrading the heat radiation characteristics (thermal conductivity) of a circuit board, and wholeheartedly investigated a countermeasure to prevent clamping cracks formed in the assembly step of the circuit board or cracks formed by adding a heat cycle. As a result, the following knowledges were found, and the present invention was completed on the basis of the knowledges.

That is, when the composition and manufacturing conditions of the substrate material were properly controlled, a silicon nitride sintered body having high thermal conductivity can be obtained. The silicon nitride sintered body was used as a substrate material, a circuit layer such as a metal circuit plate was integrally formed on the substrate surface, and the thickness of the substrate was set to be a predetermined ratio or less of the thickness of the metal circuit plate, thereby forming a circuit board. In this case, clamping cracks or the like of the circuit board in the assembly step could be effectively reduced, heat cycle resistance characteristics could be considerably improved, and the heat radiation of the circuit board could be considerably improved because the thickness of the substrate could be reduced. The circuit board of the present invention has deflection or anti-breaking strength which are considerably higher than those of a circuit board consisting of aluminum nitride.

With respect to a substrate material itself, the present inventors examined the type of a conventionally used silicon nitride powder, the type and addition amount of a sintering assistant or an additive, and sintering conditions, and developed a silicon nitride sintered body having high thermal conductivity which was twice or more than the thermal conductivity of a conventional silicon nitride sintered body. In addition, the following was confirmed by an experiment. That is, when the silicon nitride sintered body was used as a substrate material, and a metal circuit plate having electrical conductivity was integrally bonded to the surface of the substrate material to manufacture a circuit board, a silicon nitride circuit board which satisfied all of mechanical strength, a toughness or tenacity value, heat cycle resistance characteristics, and heat radiation characteristics could be obtained.

When a large-area circuit board was manufactured by mounting a plurality of semiconductor elements on a single substrate, it was confirmed by an experiment that a silicon nitride circuit board which satisfied the above characteristics and assembling or packaging characteristics could be obtained.

With respect to a substrate material itself, a source mixture obtained by adding predetermined amounts of rare earth element oxides or the like to a fine silicon nitride powder having high purity was molded and degreased, and the resultant molded body was held at a predetermined temperature for a predetermined time and sintered for high density, and the resultant body was cooled at a cooling rate lower than a predetermined rate. The resultant sintered body was ground and polished to manufacture a silicon nitride sintered body. In this case, it was found that the silicon nitride sintered body had thermal conductivity twice or more than that of a conventional silicon nitride sintered body, i.e., 60 W/m K or more, and has high strength and high toughness or tenacity such that three-point bending strength was set to be 650 MPa or more, and a novel silicon nitride material which satisfied heat radiation characteristics and strength characteristics was developed. When this silicon nitride material was applied as a circuit board according to the present invention, it was found that heat radiation characteristics, durability, and heat cycle resistance characteristics could be simultaneously improved.

A silicon nitride sintered body according to the present invention was described here. A high-purity silicon nitride source powder in which the amount of a specific impurity cation element such as oxide or Li, Na, K, Fe, Ca, Mg, Sr, Ba, Mn, or B which prevented high thermal conductivity was used, and the silicon nitride source powder was sintered under the above conditions. In this case, generation of a glass phase (amorphous phase) in a grain boundary phase could be effectively suppressed, and a crystal compound in the grain boundary phase was set to be 20 volume % or more (to the overall grain boundary phase), more preferably, 50 volume % or more. As a result, even if only a rare earth element oxide was added to the source powder, knowledge that a silicon nitride sintered substrate having a high thermal conductivity of 60 W/m K or more, more particularly, 80 W/m K or more could be obtained, was obtained.

Conventionally, upon completion of a sintering operation, when a power supply for heating of a sintering furnace was turned off to cool the sintered body in the furnace, a cooling rate was high, i.e., 400 to 800° C. per hour. According to the experiment by the present inventor, when a cooling rate was controlled to be 100° C. or less per hour, more preferably, 50° C. or less per hour, the following was found. That is, the grain boundary phase of the silicon nitride sintered body structure was changed from an amorphous state to a phase including a crystal phase, and high strength characteristics and high thermal conductivity characteristics were simultaneously achieved.

The silicon nitride sintered body itself having a high thermal conductivity of 60 W/m·K or more has been partially filed as patent applications by the present inventors, and disclosed in Japanese Unexamined Patent Publication Nos. 6-135771 and 7-48174. The silicon nitride sintered body described in the patent publications contains 2.0 to 7.5 wt % of a rare earth element as an oxide. The silicon nitride sintered body itself used in the present invention includes this silicon nitride sintered body.

The present inventors have improved and examined the silicon nitride sintered body. As a result, when a silicon nitride sintered body containing larger than 7.5 wt % of a rare earth element as an oxide, the heat conductivity of the sintered body further increases, and preferable sintering characteristics can be obtained.

For this reason, a sintered body containing larger than 7.5 wt % of a rare earth element is preferably used. When the rare earth element is a lanthanoid element, the above effect becomes conspicuous. In this case, when a ratio of the crystal compound phase to the overall grain boundary phase is 60 to 70%, the sintered body can achieve a high thermal conductivity of 110 to 120 W/m K or more.

Although the novel silicon nitride sintered body has a high thermal conductivity itself, this thermal conductivity is relatively lower than the heat conductivity (170 to 270 W/m K) of a high-quality aluminum nitride sintered body which is actually used. However, high strength and high toughness characteristics which are original characteristics of the silicon nitride sintered body are not degraded.

In consideration of characteristics required by respective parts of a circuit board, for example, the silicon nitride sintered body is arranged at a part of the circuit board which requires high strength characteristics, and an AlN sintered body having a high thermal conductivity is arranged at a part, such as a portion immediately below which a semiconductor element is mounted, which requires heat radiation characteristics, thereby manufacturing a composite substrate. In addition, when a silicon nitride sintered body and an AlN sintered body are stacked on each other, a composite substrate can be manufactured.

A silicon nitride sintered body which satisfies high strength characteristics and high thermal conductivity characteristics at once is used as a substrate material, and a metal circuit board is integrally bonded to the surface of the substrate material, thereby forming a circuit board. In this manner, the toughness strength and thermal conductivity of the overall circuit board can be improved. In particular, it is found that clamping cracks in the assembly step of the circuit board and cracks formed by being applied a heat cycle can be effectively prevented.

Since the silicon nitride sintered body has high strength characteristics and high thermal conductivity, and excellent dielectric strength, when the silicon nitride sintered body is used as a substrate material of a circuit board, the substrate thickness can be thinner than that of a conventional substrate. The heat resistance of the overall circuit board can be reduced due to a decrease in substrate thickness, and it is found that the heat radiation characteristics of the circuit board can be synergistically improved due to the high thermal conductivity of the substrate material itself.

In this case, when the silicon nitride sintered body is used as a substrate material, even if tough pitch electrolytic copper containing 100 to 1,000 ppm of oxygen or copper having a surface oxide layer is used as the metal circuit plate, the metal circuit plate cannot be easily bonded to the silicon nitride sintered body. Theoretically, for example, as described in Japanese Unexamined Patent Publication No. 52-37914, an eutectic melted body must be generated by heating at a predetermined temperature, thereby bonding the substrate material to the metal circuit plate. However, the substrate material and the metal circuit plate are not actually bonded to each other.

With respect to this problem, the present inventor considered that the substrate material and the metal circuit plate could not be bonded to each other for the following reason. That is, although an eutectic melted body was generated by heating at the predetermined temperature (in case of copper, 1,065° C. to 1,083° C.) in a direct bonding operation, the wettability between the generated eutectic melted body and the silicon nitride sintered body was poor.

According to the above knowledge, in order to improve the wettability between the eutectic melted body and the silicon nitride sintered body in heating, after an oxide layer having a thickness of 0.5 to 10 μm is formed on the surface of the silicon nitride sintered body (substrate), the silicon nitride sintered body can be directly bonded to the tough pitch electrolytic copper containing 100 to 1,000 ppm of oxygen, copper having an oxide layer formed on its surface, or the like by heating at a predetermined temperature.

In this case, when only an oxide layer is formed on the surface of the silicon nitride substrate, direct bonding can be performed. In addition, the following is found. That is, even if the metal circuit plate consists of tough pitch electrolytic copper containing 100 to 1,000 ppm of oxygen, when a copper oxide layer having a predetermined thickness is formed on the surface of the copper circuit plate in advance, the bonding strength between the silicon nitride substrate and the copper circuit plate is further improved, and the durability of the circuit board is further improved.

The bonding strength between the substrate and the metal circuit plate is higher when the surface of the silicon nitride is roughened by a blast process or the like to have a surface roughness in terms of center line average height (Ra) of 5.0 to 10.0 μm than when the surface of the silicon nitride substrate is smooth. The surface of the silicon nitride substrate is preferably roughened.

The present invention is completed on the basis of the above knowledges. More specifically, according to the first invention of this application, there is provided a silicon nitride circuit board in which a metal circuit plate is bonded to a high thermal conductive silicon nitride substrate having a thermal conductivity of 60 W/m K or more characterized in that, when the thickness of the high thermal conductive silicon nitride substrate is represented by $D_s$, and the thickness of the metal circuit plate is represented by $D_M$, a relational formula $D_s \leq 2D_M$ is satisfied.

The metal circuit board may be bonded to the high thermal conductive silicon nitride substrate through a metal bonding layer containing at least one active metal selected from the group consisting of Ti, Zr, Hf, and Nb. The metal circuit plate may also be directly bonded to the high thermal conductive silicon nitride substrate through an oxide layer.

In the silicon nitride circuit board, the thickness $D_s$ of the high thermal conductive silicon nitride substrate and the thickness $D_M$ of the metal circuit plate more preferably satisfy a relational formula $D_M \leq D_s \leq (5/3)D_M$.

According to the second invention of this application, there is provided a silicon nitride circuit board in which a circuit layer is integrally bonded to a high thermal conductive silicon nitride substrate having a thermal conductivity of 60 W/m K or more, characterized in that, when a load is applied on the central portion of the circuit board which is held at a support interval of 50 mm, a maximum deflection of the circuit board is 0.6 mm or more until the silicon nitride substrate is broken.

According to the third invention of this application, there is provided a silicon nitride circuit board in which a circuit layer is integrally bonded to a high thermal conductive silicon nitride substrate having a thermal conductivity of 60 W/m K or more, characterized in that, when an anti-breaking test (transverse test) is performed to the circuit board which is held at a support interval of 50 mm, an anti-breaking strength is 500 MPa or more.

The thickness of the high thermal conductive silicon nitride substrate is preferably set to be 0.8 mm or less, more preferably, 0.5 mm or less. The circuit layer is a copper circuit plate, and the copper circuit plate can be directly bonded to the silicon nitride substrate with a Cu—O eutectic compound. The circuit layer may be a copper circuit plate, and the copper circuit plate may be bonded to the silicon nitride substrate through an active metal soldering layer (active metal brazing layer) containing at least one active metal selected from the group consisting of Ti, Zr, Hf, and Nb. The circuit layer may consist of a refractory metal metallized layer containing W or Mo and at least one active metal selected from the group consisting of Ti, Zr, Hf and Nb.

The high thermal conductive silicon nitride substrate according to the present invention is characterized by constituted by a silicon nitride sintered body containing 2.0 to 17.5 wt % of a rare earth element as an oxide and a total of 0.3 wt % or less of Li, Na, K, Fe, Ca, Mg, Sr, Ba, Mn, and B as impurity cation element.

In another expression, the high thermal conductive silicon nitride substrate according to the present invention is constituted by a silicon nitride sintered body containing 2.0 to 17.5 wt % of a rare earth element as an oxide, constituted by a silicon nitride crystal phase and grain boundary phase, and having a ratio of a crystallized compound phase to the overall grain boundary phase which is 20% or more.

The high thermal conductive silicon nitride substrate is more preferably constituted by a silicon nitride sintered body constituted by a silicon nitride crystal phase and a grain boundary phase and having a ratio of a crystallized compound phase to the overall grain boundary phase which is 50% or more.

According to the fourth invention of this application, a silicon nitride circuit board is characterized in that an oxide layer having a thickness of 0.5 to 10 μm is formed on the surface of a high thermal conductive silicon nitride substrate containing a total of 0.3 wt % or less of Li, Na, K, Fe, Ca, Mg, Sr, Ba, Mn, and B as impurity cation elements and having a thermal conductivity of 60 W/m K or more, and a metal circuit plate is directly bonded to the silicon nitride substrate through the oxide layer.

When the silicon nitride circuit board according to the fourth invention of this application is expressed in other words with respect to a high thermal conductive silicon nitride substrate, the silicon nitride circuit board can be defined to be characterized in that an oxide layer having a thickness of 0.5 to 10 μm is formed on the surface of a high thermal conductive silicon nitride substrate constituted by silicon nitride grains and a grain boundary phase, having a ratio of a crystallized compound phase to the overall grain boundary phase which is 20% or more, and having a thermal conductivity of 60 W/m K or more, and a metal circuit plate is directly bonded to the silicon nitride substrate through the oxide layer.

Even if the metal circuit plate consists of tough pitch electrolytic copper containing 100 to 1,000 ppm of oxygen, the metal circuit plate is preferably constituted by a copper circuit plate having a copper oxide layer having a thickness of 1.0 μm or more on its surface to improve the bonding strength.

In this case, when the metal circuit plate is a copper circuit plate, oxygen is preferably used as a bonding agent in a direction bonding method. For this reason, this copper circuit plate is bonded to the silicon nitride substrate by a Cu—O eutectic compound. When the metal circuit plate is an aluminum circuit plate, aluminum is preferably used as a bonding agent in the direction bonding method. For this reason, the aluminum circuit plate is preferably bonded to the silicon nitride substrate by an Al—Si eutectic compound.

According to the fifth invention of this application, there is provided a silicon nitride circuit board in which a circuit layer is bonded to a high thermal conductive silicon nitride substrate containing 2.0 to 17.5 wt % of a rare earth element as an oxide and a total of 0.3 wt % or less of Li, Na, K, Fe, Ca, Mg, Sr, Ba, Mn, and B as impurity cation elements and having a thermal conductivity of 60 W/m K or more, characterized in that a plurality of semiconductor elements are mounted on the high thermal conductive silicon nitride substrate through the circuit layer.

When the silicon nitride circuit board according to the fifth invention of this application is expressed in other words with respect to a high thermal conductive silicon nitride substrate, the silicon nitride circuit board can be defined to be characterized in that a circuit layer is bonded to a high thermal conductive silicon nitride substrate containing 2.0 to 17.5 wt % of a rare earth element as an oxide and a total of 0.3 wt % or less of Li, Na, K, Fe, Ca, Mg, Sr, Ba, Mn, and B as impurity cation elements, constituted by a silicon nitride crystal phase and a grain boundary phase, having a ratio of a crystallized compound phase to the overall grain boundary phase which is 20% or more, and having a thermal conductivity of 60 W/m K or more, and a plurality of semiconductor elements are mounted on the high thermal conductive silicon nitride substrate through the circuit layer.

The high thermal conductive silicon nitride substrate is preferably constituted by a silicon nitride sintered body containing 2.0 to 17.5 wt % of a rare earth element as an oxide, constituted by a silicon nitride crystal phase and a grain boundary phase, and having a ratio of a crystallized compound phase to the overall grain boundary phase which is 50% or more.

According to the sixth invention of this application, there is provided a composite silicon nitride circuit board characterized in that a high thermal conductive silicon nitride substrate having a thermal conductivity of 60 W/m K or more and an aluminum nitride substrate are arranged on the same plane, and a metal circuit plate is bonded to the high thermal conductive silicon nitride substrate and the aluminum nitride substrate through an oxide layer formed on the surface of the high thermal conductive silicon nitride substrate and the aluminum nitride substrate.

A metal plate is preferably bonded to the high thermal conductive silicon nitride substrate and the aluminum nitride substrate through an oxide film formed on the rear surface of the high thermal conductive silicon nitride substrate and the aluminum nitride substrate. The metal plate is preferable to be directly bonded to both the surfaces of the high thermal conductive silicon nitride substrate and the aluminum nitride substrate through the oxide layer.

More specifically, in the composite silicon nitride circuit board according to the present invention, the aluminum nitride substrate having excellent thermal conductivity is combined to the silicon nitride substrate having high strength and high toughness to make it possible to obtain a composite silicon nitride circuit board having the above characteristics. The arrangement states of the silicon nitride substrate and the aluminum nitride substrate are roughly classified into two types. That is, there are a state wherein both the substrates are arranged adjacent to each other on the same plane and a state wherein both the substrates are stacked on each other to have a sandwich structure. Both the states may be used at once as required.

For example, when a silicon nitride substrate having high strength and high toughness is arranged on the surface side of an aluminum nitride substrate having excellent thermal conductivity, and the surface portion on which a mechanical pressure, a mechanical stress, or the like directly apply is constituted by the silicon nitride substrate having high strength and high toughness, clamping cracks in the assembly step or cracks formed by being applied a heat cycle can be suppressed. Since thermal conductivity is distributed by the aluminum nitride substrate, thermal conductivity can be kept high.

The composite silicon nitride circuit board according to the sixth invention of this application can be expressed to be characterized in that the high thermal conductive silicon nitride substrate having a thermal conductivity of 60 W/m K or more and the aluminum nitride substrate are arranged on the same plane, and a metal circuit plate is bonded to the high thermal conductive silicon nitride substrate and the aluminum nitride through a metal bonding layer formed on the surface of the high thermal conductive silicon nitride substrate and the aluminum nitride and containing at least one active metal selected from the group consisting of Ti, Zr, Hf, and Nb.

A metal plate is preferably bonded to the high thermal conductive silicon nitride substrate and the aluminum nitride substrate through a metal bonding layer formed on the rear surface of the high thermal conductive silicon nitride substrate and the aluminum nitride substrate. The thickness of the metal circuit plate is preferably set to be larger than that of the metal plate. The metal plate is bonded to both of the high thermal conductive silicon nitride substrate and the aluminum nitride substrate through the metal bonding layer. In addition, at least one metal circuit plate is preferably bonded to both of the high thermal conductive silicon nitride substrate and the aluminum nitride substrate through a metal bonding layer.

According to the seventh invention of this application, there is provided a composite silicon nitride circuit board constituted by stacking a high thermal conductive silicon nitride substrate having a thermal conductivity of 60 W/m K or more and an aluminum nitride substrate, characterized in that the aluminum nitride substrate is sandwiched by the silicon nitride substrates and bonded to the silicon nitride substrate through a metal bonding layer containing at least one active metal selected from the group consisting of Ti, Zr, Hf, and Nb.

In this case, the aluminum nitride substrate and the silicon nitride substrate are integrally bonded to each other by an active metal bonding method, a glass bonding method, or a direct bonding method as in the bonding method of the metal plate. The thickness of the aluminum nitride substrate is preferably set to be larger than that of high thermal conductive silicon nitride substrate.

As a bonding method of the silicon nitride substrate and the metal circuit plate, a bonding agent such as a soldering material is not used, but a method of forming an oxide layer on the surface of the silicon nitride substrate and directly bonding the metal circuit plate may be used. When the metal circuit plate is a copper circuit plate, tough pitch electrolytic copper containing about 100 to 1,000 ppm of oxygen is used, both the members are directly bonded to each other (DBC method) on a bonding interface by an eutectic compound between copper and a copper oxide. More specifically, in the DBC method, tough pitch electrolytic copper containing oxygen required for forming an eutectic compound is preferably used.

As another bonding method, the following method may be used. That is, no oxide layer is formed on the surface of the silicon nitride substrate, and the silicon nitride substrate and metal circuit plate are bonded to each other by using a metal bonding layer containing an active metal as a bonding agent. In this case, the metal circuit plate need not contain an oxygen, and consists of oxygen-free copper, copper phosphate, or electrolytic copper.

A lanthanoid element is more preferably used as the above rare earth element to improve the thermal conductivity of the silicon nitride substrate.

The high thermal conductive silicon nitride substrate may contain 1.0 wt % or less of at least one of aluminum nitride and alumina. The high thermal conductive silicon nitride substrate may contain 1.0 wt % or less of alumina together with 1.0 wt % of aluminum nitride.

The high thermal conductive silicon nitride substrate used in the present invention preferably contains 0.1 to 3.0 wt % of one element selected from the group consisting of Ti, Zr, Hf, V, Nb, Ta, Cr, Mo, and W as an oxide. One element selected from the group consisting of Ti, Zr, Hf, V, Nb, Ta, Cr, Mo, W can be contained in the high thermal conductive silicon nitride substrate by adding the selected element to a silicon nitride powder as an oxide, a carbide, a nitride, a silicide, or a boride.

The high thermal conductive silicon nitride substrate used in the present invention is manufactured by the following method. That is, a source mixture obtained such that 2.0 to 17.5 wt % of a rare earth element as an oxide and 1.0 wt % or less of at least one of alumina and aluminum nitride as needed are added to a silicon nitride powder containing 1.7 wt % or less of oxygen, a total of 0.3 wt % or less of Li, Na, K, Fe, Ca, Mg, Sr, Ba, Mn, and B as impurity cation elements, and 90 wt % or more of α-phase type silicon and having an average grain size of 1.0 μm or less is molded to prepare a molded body. The resultant molded body is degreased, pressed and sintered in an atmosphere having a temperature of 1,800 to 2,100° C., and the sintered body is cooled at a cooling rate of 100° C./hour or less such that the sintering temperature decreases to a temperature at which a liquid phase formed by the rare earth element in sintering is solidified.

In the above manufacturing method, 0.1 to 3.0 wt % of at least one selected from the group consisting of an oxide, a carbide, a nitride, a silicide, and a boride of Ti, Zr, Hf, V, Nb, Ta, Cr, Mo, and W may be added to the silicon nitride powder.

According to the manufacturing method described above, the following silicon nitride sintered body can be obtained. That is, the silicon nitride sintered body has excellent mechanical characteristics and excellent heat conductivity characteristics such that a grain boundary phase containing a rare earth element or the like is formed in a silicon nitride crystal structure, a porosity is 2.5 % or less, a thermal conductivity is 60 W/m K or more, and a three-point bending strength is 650 MPa or more at room temperature.

As the silicon nitride powder serving as the main component of the high thermal conductive silicon nitride substrate used in the present invention, in consideration of sintering characteristics, strength, and thermal conductivity, the following fine silicon nitride powder can preferably be used. That is, the silicon nitride powder contains 1.7 wt % or less, preferably, 0.5 to 1.5 wt % of oxygen, a total of 0.3 wt % or less, preferably, 0.2 wt % or less of impurity cation elements such as Li, Na, K, Fe, Mg, Ca, Sr, Ba, Mn and B, and 90 wt % or more, preferably, 93 wt % or more of α-phase type silicon, and has an average grain size of 1.0 μm or less, preferably, about 0.4 to 0.8 μm.

When a fine source powder having an average grain size of 1.0 μm or less is used, even if a small amount of sintering assistant is used, a dense sintered body having a porosity of 2.5% or less can be formed. In addition, the probability of causing the sintering assistant to degrade thermal conductivity characteristics decreases.

Since the impurity cationic elements such as Li, Na, K, Fe, Ca, Mg, Sr, Ba, Mn and B serve as materials which degrade thermal conductivity characteristics, in order to assure a thermal conductivity of 60 W/m K or more, the total amount of the impurity cationic elements must be set to be 0.3 wt % or less. For the same reason as described above, the total amount of the impurity cationic elements is more preferably set to be 0.2 wt % or less. In this case, since a silicon nitride powder used to obtain an ordinary silicon nitride sintered body contains a relatively large amount of Fe, Ca and Mg, the total amount of the impurity cation elements is mainly based on the total amount of Fe, Ca and Mg.

When the silicon nitride source powder containing 90 wt % of α-phase type silicon nitride which is excellent more than β-phase type silicon nitride in sintering characteristics is used, a sintered body having a high density can be manufactured.

As a rare earth element added to the silicon nitride source powder as a sintering assistant, an oxide of Ho, Er, Yb, Y, La, Sc, Pr, Ce, Nd, Dy, Sm, or Gd is used. The silicon nitride source powder may contain one oxide or a combination between two or more oxides in the sintering operation. In particular, holmium oxide ($Ho_2O_3$) or erbium oxide ($Er_2O_3$) are preferably used.

When lanthanoid elements such as Ho, Er, and Yb are used as rare earth elements, sintering characteristics or thermal conductivity become excellent, and a sintered body having a sufficient density can be obtained in a low-temperature region of about 1,850° C. Therefore, the equipment cost and running cost of a sintering apparatus can be reduced. These sintering assistants reacts the silicon nitride source powder to generate a liquid phase, and functions as a sintering accelerator.

The amount of the sintering assistants added to the silicon nitride source powder is set within the range of 2.0 to 7.5 wt % calculated as an oxide thereof with respect to the source powder. When this amount is smaller than 2.0 wt %, the density of the sintered body is insufficient. In particular, when the rare earth element is an element such as a lanthanoid element having a large atomic weight, a sintered body having low strength and low thermal conductivity is formed. On the other hand, when the amount exceeds 17.5 wt % to be an excessive amount, an excessive grain boundary phase is generated, and the thermal conductivity or strength of the sintered body begin to decrease. For this reason, the amount is set within the above range. For the same reason as described above, the amount is preferably set to be 4 to 15 wt %.

An oxide, a carbide, a nitride, a silicate, and a boride of Ti, Zr, Hf, V, Nb, Ta, Cr, Mo, and W which are used as other selective additional components in the above manufacturing method accelerate the function of the sintering accelerator of the rare earth element, and perform a function of strengthening dispersion in the crystal structure to improve the mechanical strength of an $Si_3N_4$ sintered body. Especially, compounds of Hf and Ti are preferably used. When the amount of these compounds is smaller than 0.1 wt %, the addition effect is insufficient. On the other hand, when the amount exceeds 3.0 wt % to be an excessive amount, thermal conductivity, mechanical strength, and dielectric breakdown strength are degraded. Therefore, the amount is set within the range of 0.1 to 3.0 wt %. In particular, the amount is preferably set to be 0.2 to 2 wt %.

The compound of Ti, Zr, Hf, or the like also functions as a light-shielding agent for coloring the silicon nitride sintered body black to make it opaque. For this reason, when a circuit board on which an integrated circuit or the like which easily performs an erroneous operation by light is to be manufactured, the above compound of Ti or the like is properly added to the sintered body, and a silicon nitride substrate having excellent light-shielding characteristics is preferably manufactured.

In the above manufacturing method, alumina ($Al_2O_3$) serving as another selective additional component functions to accelerate the function of the sintering accelerator of the rare earth element, and performs a remarkable effect when a pressured sintering operation is performed. When the amount of $Al_2O_3$ is smaller than 0.1 wt %, the density of the sintered body is insufficient. On the other hand, when the amount exceeds 1.0 wt % to be an excessive amount, an excessive grain boundary phase is generated, or $Al_2O_3$ begins to be solid-solved in silicon nitride, thereby decreasing thermal conductivity. Therefore, the amount of $Al_2O_3$ is set to be 1 wt % or less, preferably set within the range of 0.1 to 0.75 wt %. In order to assure preferable strength and thermal conductivity, the amount is preferably set within the range of 0.1 to 0.6 wt %.

When $Al_2O_3$ is used together with AlN (to be described later), the total amount of the compounds is preferably set to be 1.0 wt % or less.

Aluminum nitride (AlN) serving as another additional component suppresses evaporation of silicon nitride in the sintering step, and functions to accelerate the function of the rare earth element serving as a sintering accelerator.

When the amount of AlN is smaller than 0.1 wt % (0.05 wt % when AlN is used together with alumina), the density of the sintered body is easily insufficient. On the other hand, when the amount exceeds 1.0 wt % to be an excessive amount, an excessive grain boundary phase is generated, or AlN begins to be solid-solved in silicon nitride, thereby decreasing thermal conductivity. For this reason, the amount of AlN is set within the range of 0.1 to 1.0 wt %. In particular, in order to assure preferable sintering characteristics, strength, and thermal conductivity, the amount is preferably set within the range of 0.1 to 0.5 wt %. When AlN is used together with $Al_2O_3$, the amount of AlN is preferably set within the range of 0.05 to 0.5 wt %.

Since the porosity of the sintered body considerably influences on the thermal conductivity and strength, the sintered body is manufactured to have a porosity of 2.5% or less, preferably, 0.5% or less. When the porosity exceeds 2.5%, the thermal conductivity is influenced, the thermal conductivity of the sintered body decreases, and the strength of the sintered body is degraded.

Although the silicon nitride sintered body is structurally constituted by a silicon nitride crystal phase and a grain boundary phase, the ratio of a crystallized compound phase to the grain boundary considerably influences the thermal conductivity of the sintered body. In a high thermal conductive silicon nitride substrate used in the present invention, the ratio must be set to be 20% or more, and the ratio is preferably set to be 50% or more. When the ratio of the crystal phase is lower than 20%, a sintered body which has excellent heat radiation characteristics and excellent high-temperature strength to obtain the thermal conductivity of 60 W/m K or more cannot be obtained.

In order to set the porosity of the silicon nitride substrate to be 2.5% or less, or set the ratio of the crystal phase to the grain boundary phase formed in the silicon nitride crystal structure to be 20% or more, it is important that the silicon nitride molded body is pressure-sintered at a temperature of 1,800° C. to 2,100° C. for about 2 to 10 hours and moderately cooled such that a cooling rate of the sintered body immediately after the sintering operation is completed is set to be 100° C. /hour or less.

When a sintering temperature is set to be lower than 1,800° C., the density of the sintered body is insufficient, and the porosity thereof becomes 2.5 vol % or more, thereby decreasing the mechanical strength and thermal conductivity of the sintered body. On the other hand, when the sintering temperature exceeds 2,100° C., a silicon nitride component itself easily evaporated and decomposed. When the sintering is not performed under pressured atmospheric condition but performed under atmospheric pressure, silicon nitride begins to decomposed and evaporated from about 1,800° C.

The cooling rate of the sintered body immediately after the sintering operation is completed is an important control factor for crystallizing the grain boundary phase. When rapid cooling is performed such that a cooling rate exceeds 100° C./hour, the grain boundary phase of the sintered body structure becomes amorphous (glass phase), the ratio of a liquid phase generated in the sintered body to the grain boundary phase serving as a crystal phase becomes lower than 20%, and both the strength and thermal conductivity decrease.

A temperature range in which the cooling rate is exactly adjusted is satisfactorily set to be a temperature range of a predetermined sintering temperature (1,800 to 2,100° C. ) to a temperature at which the liquid phase generated by the reaction of the sintering assistant is solidified. The solidifying point of the liquid phase when the sintering assistant is used is approximately 1,600 to 1,500° C. When the cooling rate of the sintered body from at least the sintering temperature to the solidifying temperature of the liquid phase is controlled to be 100° C./hour or less, preferably, 50° C. /hour or less, more preferably, 25° C./hour or less, 20% or more, preferably 50% or more of the grain boundary phase becomes a crystal phase. As a result, a silicon nitride substrate having excellent thermal conductivity and excellent mechanical strength can be obtained.

The high thermal conductive silicon nitride substrate used in the present invention is manufactured through, e.g., the following processes. That is, a predetermined amount of sintering assistant, a necessary additive such as an organic binder, and, if necessary, a compound of $Al_2O_3$, AlN, Ti, Zr, or Hf are added to a fine silicon nitride powder having the predetermined small grain size and containing a small impurity content to prepare a source mixture. The resultant source mixture is molded to obtain a molded body having a predetermined shape. As a method of molding the source mixture, a general metal mold (die) pressing method or a sheet molding method such as a doctor blade method can be applied.

Following the above molding operation, the molded body is heated at 600 to 800° C. in a non-oxidizing atmosphere or at 400 to 500° C. in the air for 1 to 2 hours to sufficiently remove the organic binder component which is added in advance, and the molded body is degreased. Then, the degreased molded body is subjected to pressure sintering at 1,800 to 2,100° C. in an inert gas atmosphere such as a nitrogen gas, a hydrogen gas, or an argon gas for a predetermined time.

The high thermal conductive silicon nitride substrate manufactured by the above method has a porosity of 2.5% or less and a thermal conductivity of 60 W/m K (at 25° C.) or more and preferably 100 W/m K or more. The high thermal conductive silicon nitride substrate also has excellent mechanical characteristics such that a three-point bending strength is 650 MPa or more at ordinary temperature, and preferably 800 MPa or more.

A silicon nitride sintered body obtained such that high thermal conductive SiC or the like is added to a low thermal conductive silicon nitride to set the thermal conductivity of the overall sintered body to be 60 W/m K or more is out of the scope of the present invention. However, a composite silicon nitride sintered body obtained such that high thermal conductive SiC or the like is added to a silicon nitride sintered body having a thermal conductivity of 60 W/m K or more is included in the scope of the present invention as a matter of course as far as the thermal conductivity of the silicon nitride sintered body itself is 60 W/m K or more.

The thickness $D_s$ of the high thermal conductive silicon nitride substrate is variously set depending on required characteristics when the substrate is used as a circuit board. According to the present invention, when the thickness of the metal circuit plate is represented by $D_M$, assume that a relative formula $D_s \leq 2D_M$ is satisfied. More specifically, the thickness $D_s$ of the high thermal conductive silicon nitride substrate is set to be twice or less the thickness $D_M$ of the metal circuit plate. When the thickness $D_s$ of the silicon nitride substrate is set to be twice or less the thickness $D_M$ of the metal circuit plate, the heat resistance of the silicon nitride substrate having a specific thermal conductivity can be decreased, and the heat resistance of the overall circuit board can be decreased.

When the thickness $D_s$ of the high thermal conductive silicon nitride substrate and the thickness $D_M$ of the metal circuit plate are set to satisfy $D_M \leq D_s \leq (5/3)D_M$, the strength characteristics and thermal conductivity of the ceramic circuit board can be more preferably satisfied at once.

Although the thickness of the high thermal conductive silicon nitride substrate consisting of the silicon nitride sintered body is variously set depending on required characteristics when the high thermal conductive silicon nitride substrate is used as a circuit board, the thickness of the high thermal conductive silicon nitride substrate is set to be twice or less the thickness of a circuit layer. In this manner, in a substrate having a small thickness and a predetermined thermal conductivity, heat radiation characteristics of the circuit board can be increased.

In this case, the actual thickness of the high thermal conductive silicon nitride substrate is set within the range of 0.25 to 0.8 mm. In particular, when the thickness of the silicon nitride substrate is set to be 0.5 mm or less, preferably, 0.4 mm or less, the thickness of the overall circuit board can be reduced, and the difference between the heat resistances of the upper and lower surfaces of the circuit board can be more effectively reduced. For this reason, the heat radiation characteristics of the overall circuit board can be more improved. In order to assure the strength characteristics of the substrate, the thickness $D_s$ of the high thermal conductive silicon nitride substrate is preferably set to be smaller than the thickness $D_M$ of the metal circuit plate.

The silicon nitride circuit board according to the present invention is manufactured such that a circuit layer such as a metal circuit plate having conductivity is integrally bonded to the surface of a high thermal conductive silicon nitride substrate manufactured as described above, and a semiconductor element is mounted on the metal circuit plate.

A method of forming or bonding a circuit layer such as the metal circuit plate is not limited to a specific method. A direct bonding method, an active metal brazing method, or a metallizing method which will be described later can be applied.

The direct bonding method is a method of directly bonding ceramic and a metal without interposing a bonding layer such as a metallized layer. According to the direct bonding method, an eutectic body as bonding agent (oxygen in case of copper) existing in a metal or on a metal surface and the metal is generated, and both the members are directly bonded to each other by using the eutectic compound as a bonding agent.

This direct bonding method can be applied to only oxide-based ceramic such as $Al_2O_3$. In a case where the direct bonding method is directly applied to a silicon nitride substrate, wettability to the substrate is poor. For this reason, a sufficient bonding strength of the metal circuit plate cannot be obtained.

To cope with this problem, an oxide layer must be formed on the surface of the silicon nitride substrate in advance to improve the wettability to the substrate. This oxide layer is formed such that the high thermal conductive silicon nitride substrate is heated at about 1,000 to 1,400° C. in an oxidizing atmosphere such as the air for 2 to 15 hours. When the thickness of the oxide layer is smaller than 0.5 μm, wettability is slightly improved. On the other hand, when the thickness exceeds 10 μm, the improvement is saturated, and the thermal conductivity easily decreases. For this reason, the thickness of the oxide layer must be set within the range of 0.5 to 10 μm, more preferably, the range of 1 to 5 μm.

Although the above oxide layer consists of $SiO_2$ which is an oxide of an $Si_3N_4$ substrate component at the beginning, in the bonding operation of the metal circuit plate by heating, a rare earth element oxide added to the $Si_3N_4$ substrate as a sintering assistant is diffused and moved toward the oxide layer. As a result, a composition obtained by diffusing the rare earth oxide in the oxide layer is obtained. When $Y_2O_3$ is used as the sintering assistant, the oxide layer after the heating-bonding operation consists of $SiO_2$—$Y_2O_3$ compound such as yttria silicate containing about 1 to 20 wt % of $Y_2O_3$.

As a metal constituting the metal circuit plate, copper, aluminum, iron, nickel, chromium, silver, molybdenum, or cobalt is singly used, or an alloy of these metals is used. That is, the metal constituting the metal circuit plate is not limited to a specific metal if the metal can generate an eutectic compound together with a substrate component and can be applied to the direct bonding method. In particular, in consideration of conductivity and cost, copper, aluminum, or an alloy thereof is preferably used.

The thickness of the metal circuit plate (circuit layer) is determined in consideration of a conductive capacity or the like. The thickness of the silicon nitride substrate is set within the range of 0.25 to 1.2 mm, and the thickness of the metal circuit plate is set within the range of 0.1 to 0.5 mm. In this case, when the silicon nitride substrate is combined to the metal circuit plate, the circuit board is not easily influenced by deformation caused by a thermal expansion difference.

When a copper circuit plate as the metal circuit plate, a copper circuit plate consisting of tough pitch electrolytic copper containing 100 to 1,000 ppm of oxygen is used, or a copper circuit plate consisting of an copper material having an oxygen content of 100 ppm or less or oxygen-free copper is used. In this case, as will be described later, when a copper oxide layer having a predetermined thickness is formed on the surface of the copper circuit plate in advance, the silicon nitride substrate can be bonded to the copper circuit plate by the direct bonding method. However, even if the copper circuit plate consisting of the tough pitch electrolytic copper, in order to increase an amount of generated Cu—O eutectic body and to improve the bonding strength between the substrate and the copper circuit plate, the copper oxide layer having a predetermined thickness is preferably formed on the surface of the copper circuit plate in advance.

The copper oxide layer is formed by performing a surface oxidizing treatment in which a metal circuit plate is heated at 150 to 360° C. in the air for 20 to 120 seconds. In this case, when the thickness of the copper oxide layer has a thickness of smaller than 1 $\mu$m, an amount of generated Cu—O eutectic body decreases. For this reason, the number of non-bonded portions between the substrate and the copper circuit plate increases, and sufficient bonding strength cannot be obtained.

On the other hand, when the thickness of the copper oxide layer exceeds 10 $\mu$m, the bonding strength is slightly increased, and the electrical conductive characteristics of the copper circuit plate are degraded. Therefore, the thickness of the copper oxide layer formed on the copper circuit plate is preferably set within the range of 1 to 10 $\mu$m. For the same reason as described above, the thickness is more preferably set within the range of 1 to 5 $\mu$m.

The bonding strength tends to be higher when the surface of the copper circuit plate is rough than when the surface is smooth. In the surface oxidizing treatment, when the heating temperature increases, or a processing time is prolonged, the surface roughness of the copper circuit plate can be increased. The surface roughness of the copper circuit plate after the surface oxidizing treatment is preferably set such that a center line average height (Ra) is set within the range of 5 to 10 $\mu$m. If necessary, the surface of the copper circuit plate may be subjected to a honing process to adjust the surface roughness of the copper circuit plate.

When the metal circuit plate is a copper circuit plate, the following bonding operation can be performed. That is, a copper circuit plate is arranged at a predetermined position of the surface of the high thermal conductive silicon nitride substrate on which an oxide layer is formed such that the copper circuit plate is in contact with the high thermal conductive silicon nitride substrate, and the copper circuit plate is pressed toward the substrate, the resultant structure is heated to a temperature lower than the melting point (1,083° C.) of copper and higher than the eutectic temperature (1,065° C.) of copper-copper oxide. The copper circuit plate is directly bonded to the surface of the high thermal conductive silicon nitride substrate by using the generated Cu—O eutectic compound liquid phase as a bonding agent. This direct bonding method is a so-called copper direct bonding method (DBC: Direct Bonding Copper method). When a semiconductor element (Si chip) is mounted, by soldering, at a predetermined position of the copper circuit plate directly bonded to the substrate, an $Si_3N_4$ circuit board according to the present invention is manufactured.

When the metal circuit plate is an aluminum circuit plate, Si is selected as a bonding agent, an Al circuit plate is pressed against the surface of an $Si_3N_4$ substrate. The resultant structure is heated to a temperature higher then the eutectic temperature of aluminum-silicon, and the Al circuit plate is directly bonded to the surface of the $Si_3N_4$ substrate by using the generated Al—Si eutectic compound liquid phase (eutectic melted body) as a bonding agent. When a semiconductor element is mounted, by soldering, at a predetermined position of the Al circuit plate directly bonded to the substrate, an $Si_3N_4$ circuit board according to the present invention is manufactured.

In the $Si_3 N_4$ circuit board according to the present invention in which the metal circuit plate is directly bonded to the surface of the $Si_3N_4$ substrate by using the direct bonding method and the semiconductor element is mounted on the metal circuit plate as described above, no adhesive or soldering material is interposed between the metal circuit plate and the $Si_3N_4$ substrate. For this reason, the difference between the heat resistances of the metal circuit plate and the substrate is small, so that the heat generated by the semiconductor element arranged on the metal circuit plate can be rapidly radiated out of the system.

A method of bonding a metal circuit plate by an active metal brazing method will be described below.

An active metal soldering layer (metal bonding layer) having a thickness of about 20 $\mu$m is formed on the surface of the silicon nitride substrate by an Ag—Cu—Ti-based soldering material containing at least one active metal selected from Ti, Zr, Hf, and Nb and having a proper composition ratio. A metal circuit plate such as a copper circuit plate is bonded to the substrate through this metal bonding layer. The active metal improves the wettability of the soldering material against to the substrate, and functions to improve the bonding strength.

As an actual example of the active soldering material, a soldering compound consisting of 1 to 10 wt % of the active metal, 15 to 35 wt % of Cu, and the remaining weight % of Ag is preferably used. The metal bonding layer is formed by a method or the like in which a bonding compound paste prepared by dispersing the soldering compound in an organic solvent is screen-printed on the surface of the silicon nitride substrate.

A metal circuit plate serving as a circuit layer is arranged on the screen-printed metal bonding layer to be in contact with the screen-printed metal bonding layer. When the resultant structure is heated to a temperature equal to or higher than, e.g., the Ag—Cu eutectic temperature (780° C.) and equal to or lower than the melting point (in case of copper; 1,083° C. ) of the metal circuit plate, the metal circuit plate is integrally bonded to the silicon nitride substrate through the metal bonding layer.

A method of forming a circuit layer by a metalize method will be described below. In the metalize method, a metalize compound containing a refractory metal such as molybdenum (Mo) or tungsten (W) and Ti or compound thereof as main components is baked on the surface of a silicon nitride substrate to form a refractory metal metalize layer serving as a circuit layer having a thickness of about 15 μm.

When the circuit layer is formed by this metalize method, it is preferable that a metal plating layer consisting of Ni or Ag and having a thickness of about 3 to 5 μm is formed on the surface of the metalize layer. When the metal plating layer is formed, the surface smoothness of the metalize layer is improved, so that the adhesion between the circuit layer and the semiconductor element or the like is improved, and soldering wettability is improved. For this reason, the bonding strength between the circuit layer and a semiconductor element using a soldering material can be improved.

The maximum deflection of the silicon nitride circuit board manufactured as described above is a factor which considerably influences on a rate of formation of clamping cracks in the assembly step of the circuit board. In the present invention, the maximum deflection can be made 0.6 mm or more, preferably 0.8 mm or more. When the maximum deflection is made 0.6 mm or more, clamping cracks of the circuit board in the assembly step can be prevented, and the production yield of a semiconductor device using the circuit board can be considerably increased.

The anti-breaking strength of the circuit board also influences on the formation ratio of clamping cracks, and is a factor for controlling whether the silicon nitride substrate can be thinned or not. In the present invention, the anti-breaking strength can be set to 500 MPa or more. When the anti-breaking strength is made 500 MPa or more, clamping cracks in the circuit board can be effectively prevented.

According to the silicon nitride circuit board according to the above arrangement, a metal circuit plate is integrally bonded to the surface of a high thermal conductive silicon nitride substrate having high-strength and high-toughness characteristics, which are original characteristics of a silicon nitride sintered body, and improved thermal conductivity. Therefore, since the toughness or tenacity value of the circuit board is high, the maximum deflection of 0.6 mm or more can be assured.

In addition, the silicon nitride substrate can be decreased in thickness in comparison with a conventional silicon nitride substrate. In this case, the anti-breaking strength of the circuit board becomes 500 MPa or more. For this reason, no clamping cracks of the circuit board are formed in the assembly step, and a semiconductor device using the circuit board can be mass-produced at a high production yield.

Even if the circuit board is increased in size so as to mount a plurality of elements on the circuit board, the maximum deflection of the circuit board can be assured to be large because the toughness or tenacity value of the substrate is high. For this reason, no clamping cracks of the circuit board are formed in the assembly step, and a semiconductor device using the circuit board can be mass-produced at a high production yield.

Further, since a plurality of semiconductor elements are mounted on the surface of a single silicon nitride substrate to constitute a circuit board, in comparison with a conventional case wherein a circuit board is formed for each semiconductor element, the total number of circuit boards can be reduced. Therefore, the assembling step of the circuit boards can be simplified, and the manufacturing efficiency of a semiconductor device can be improved.

In addition, since the toughness or tenacity value of the silicon nitride substrate is high, cracks are rarely formed in the substrate by a heat cycle, the heat cycle resistance characteristics are remarkably improved, and a semiconductor device having excellent durability and reliability can be provided.

Furthermore, since the silicon nitride substrate having a high thermal conductivity is used, even if semiconductor elements having a tendency toward high output and high integration density are mounted on the circuit board, the heat resistance characteristics are slightly degraded, and excellent heat radiation characteristics can be obtained.

In particular, since the silicon nitride substrate itself has excellent mechanical strength, when required mechanical strength characteristics are assumed to be constant, the thickness of the substrate can be reduced in comparison with a case wherein another ceramic substrate is used. Since the substrate thickness can be reduced, a heat resistance can be synergistically decreased, and heat radiation characteristics can be improved. A substrate having a thickness smaller than that of a conventional substrate can sufficiently cope with the required mechanical characteristics. For this reason, high-density assembling of the circuit boards can be performed, and a semiconductor device can be decreased in size.

On the other hand, an aluminum nitride substrate used in the sixth and seventh inventions of this application is manufactured in, e.g., the following procedures. That is, a powder mixture is prepared by adding 1 to 10 wt % of an oxide of at least one element selected from IIIa-group elements in the periodic table, Y, Sc, and a lanthanoid and 0.01 to 0.2 wt % of an Si component to a high-purity aluminum nitride source powder containing 0.5 wt % or less of an impurity cation except for a IIa-group element of the periodic table, Ca, Sr, and Ba, and the powder mixture is molded. The molded body is sintered in a temperature range of 1,650 to 1,900° C. in a non-oxidizing atmosphere, thereby manufacturing the aluminum nitride substrate.

The thermal conductivity of the aluminum nitride substrate manufactured as described above is 150 to 190 W/m·K which is higher than that of the high thermal conductive silicon nitride substrate.

In the present invention, two types of ceramic substrates are selectively used depending on required characteristics of the circuit board, and the ceramics substrates are arranged on the same plane or stacked on each other to form a composite substrate. More specifically, the silicon nitride substrate is arranged at a portion which especially requires a high structural strength. On the other hand, at a portion which especially requires high heat radiation characteristics to mount a heat-generating part such as a semiconductor element, a composite substrate is formed by arranging the aluminum nitride substrates on the same plane or stacking the aluminum nitride substrates on each other.

A composite silicon nitride circuit board according to the sixth and seventh inventions of this application is manufactured in the following manner. That is, a metal circuit plate having electrical conductivity as needed is integrally bonded to the surface of the composite substrate manufactured as described above, and a semiconductor element is mounted on the composite substrate through the metal circuit plate.

A metal plate is preferably integrally bonded to the rear surface, i.e., a surface opposing the bonding surface of the metal circuit plate, of a composite substrate obtained by compositely arranging the high thermal conductive silicon nitride substrate and the aluminum nitride substrate on the same plane. The metal plate consists of the same material as that of the metal circuit plate.

When the metal plate is integrally bonded, the circuit board can be easily bonded to a heat-radiation part such as a heat sink, warpage and deformation of the circuit board caused by the heat expansion difference between the composite substrate and the metal circuit plate can be effectively prevented.

When a structure in which at least one metal circuit plate or at least one metal plate is integrally bonded to both of the high thermal conductive silicon nitride substrate and the aluminum nitride substrate is used, the metal circuit plate and the aluminum nitride substrate which are arranged on the same plane are connected to each other. Therefore, the integration of the composite silicon nitride circuit board can be improved.

A method of bonding the metal circuit plate and the metal plate is not limited to a specific method. As this method, the direct bonding method, active metal brazing method, metalize method, or the like described above can be applied.

The composite silicon nitride circuit board according to the above arrangement is manufactured in the following manner. That is, a high thermal conductive silicon nitride substrate having high-strength and high-tenacity (toughness) characteristics, which are original characteristics of a silicon nitride sintered body, and considerably improved thermal conductivity is arranged at a portion which especially requires high structural strength. On the other hand, an aluminum nitride substrate at a portion which especially requires high heat radiation characteristics to mount a heat-generating part such as a semiconductor element. Both the substrates are arranged on the same plane or stacked on each other to constitute a composite substrate, and a metal circuit plate is integrally bonded to the surface of the composite substrate. A semiconductor element is mounted on the metal circuit plate bonded to the aluminum nitride substrate.

Therefore, heat generated from the heat-generating part such as a semiconductor element is rapidly transmitted out of the system through the aluminum nitride substrate having a high thermal conductivity, heat radiation characteristics are considerably preferable. On the other hand, since the high thermal conductive silicon nitride substrate having high-strength and high-toughness (tenacity) characteristics is arranged at the portion which requires high structural strength, the maximum deflection of the circuit board can be assured to be large. For this reason, no clamping cracks of the circuit board are formed in the assembly step, and a semiconductor devices using the circuit board can be mass-produced at a high production yield.

BEST MODE FOR CARRYING OUT THE INVENTION

Figure 1:
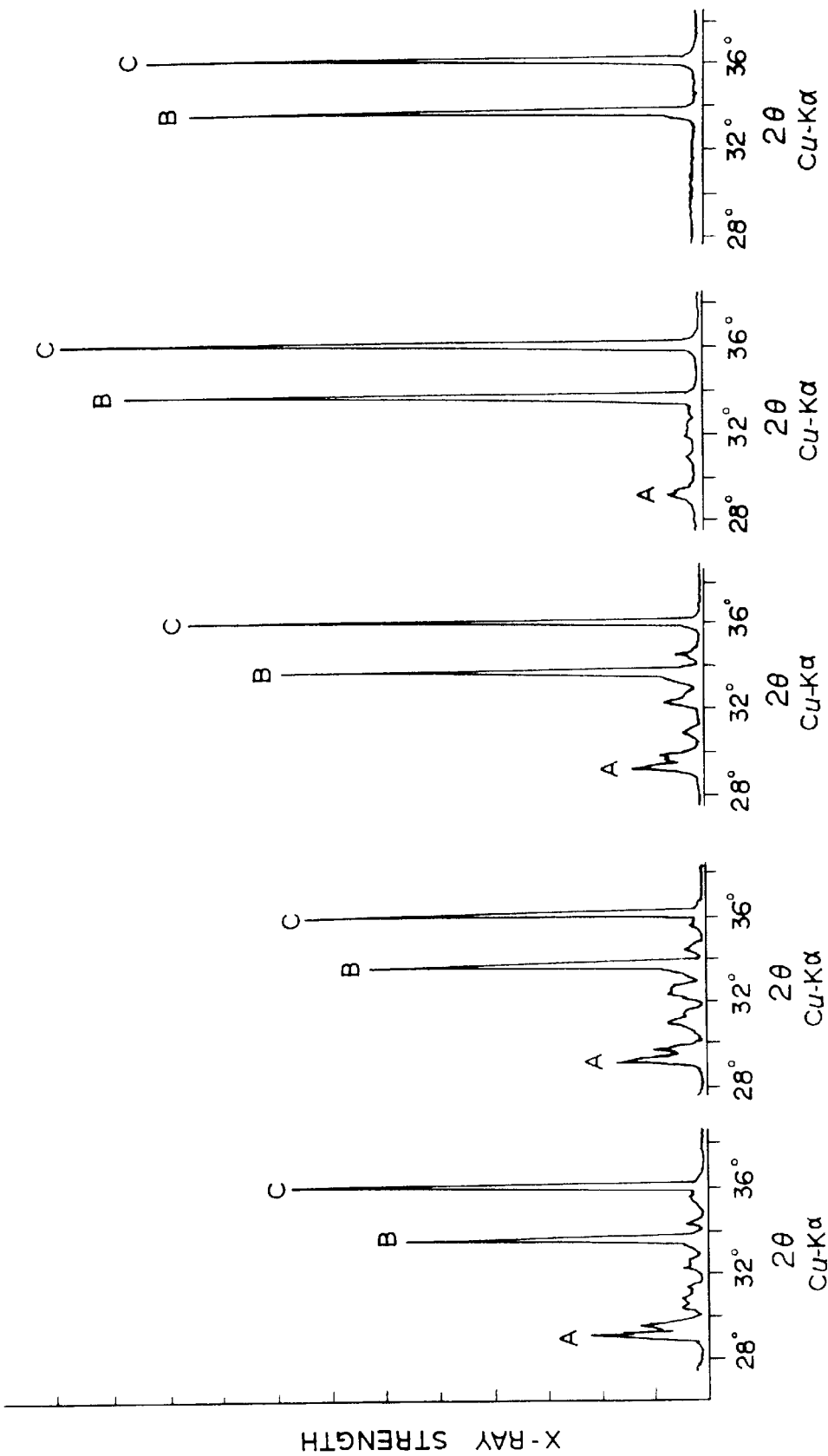
FIGS. 1(A), 1(B), 1(C), and 1(D) are X-ray diffraction diagrams of sintered bodies according to Embodiment 103, 102, and 101 and Comparative Example 101.
FIG. 1(E) is an X-ray diffraction diagram of a sintered body in which a crystallization ratio of a grain boundary phase is zero.

Embodiments of the present invention will be described with reference to the following examples.

At first, examples of a silicon nitride sintered body used as a substrate material of a silicon nitride circuit board according to the present invention will be described in comparison with a conventional material. Thereafter, circuit boards using the silicon nitride sintered body as substrate materials will be described below.

EXAMPLES 101 to 103

Twelve point five weight percents of an $Ho_2O_3$ (holmium oxide) powder having an average grain size of 0.9 μm and serving as a sintering assistant were added to a silicon nitride source powder containing 1.3 wt % of oxygen and a total amount of 0.15 wt % of Li, Na, K, Fe, Ca, Mg, Sr, Ba, Mn, and B, and 97 wt % of α-phase type silicon nitride and having an average grain size of 0.55 μm. The resultant mixture was wetly mixed by means of a ball mill. The mixing was performed in ethyl alcohol while using silicon nitride balls for 72 hours. Then, the mixed material was dried to prepare a source powder mixture.

A predetermined amount of an organic binder was added to the prepared source powder mixture, and uniformly mixed. The mixture was press-molded by a molding pressure of 1,000 kg/cm$^2$ to manufacture a large number of molded bodies each having a length of 50 mm×a width of 50 mm×a thickness of 5 mm. Each obtained molded body was degreased at 700° C. in an atmospheric gas for 2 hours. The degreased body was held at 1,950° C. and 9 atoms in a nitrogen gas atmosphere for 6 hours, and was sintered to be made dense. Thereafter, quantity of electricity to a heating apparatus arranged in a sintering furnace was controlled to moderately cool the sintered bodies such that cooling rates of the sintered bodies were adjusted to 100° C./hr (Example 101), 50° C./hr (Example 102), and 25° C./hr (Example 103) until the temperature in the furnace decreased to 1,500° C. As the result, silicon nitride sintered bodies according to Examples 101 to 103 were prepared.

Comparative Example 101

A sintering process was performed under the same conditions as those of Example 101 except that, immediately after sintering for high density was completed, the heating apparatus was turned off to rapidly cool a sintered body at a cooling rate (about 500° C./hr) in a conventional furnace, thereby to prepare a silicon nitride sintered body according to Comparative Example 101.

Comparative Example 102

The process was performed under the same conditions as those of Example 101 except that a silicon nitride source powder containing 1.5 wt % of oxygen, a total of 0.6 wt % of the impurity cation element, and 93 wt % of α-phase type silicon nitride and having an average grain size of 0.60 μm was used, thereby to prepare a silicon nitride sintered body according to Comparative Example 102.

Comparative Example 103

The process was performed under the same conditions as those of Example 101 except that a silicon nitride source powder containing 1.7 wt % of oxygen, a total of 0.7 wt % of the impurity cation element, and 91 wt % of α-phase type silicon nitride and having an average grain size of 1.2 μm was used, thereby preparing a silicon nitride sintered body according to Comparative Example 103.

The average values of the porosities, thermal conductivities (at 25° C.), and three-point bending strengths at room temperature were measured with respect to the silicon nitride sintered bodies according to Examples and Comparative Examples described above. The ratio of a crystal phase to a gain boundary phase was measured by an X-ray diffraction method with respect to each sintered body, and the result shown in Table 1 described below was obtained.

TABLE 1

| SAMPLE No. | COOLING RATE TO 1500° C. AFTER SINTERING (° C./hr) | POROSITY (%) | RATIO OF CRYSTAL PHASE TO GRAIN BOUNDARY PHASE (%) | THERMAL CONDUCTIVITY (W/m · K) | THREE-POINT BENDING STRENGTH (MPa) |
| --- | --- | --- | --- | --- | --- |
| EXAMPLE 101 | 100 | 0.7 | 32 | 98 | 820 |
| EXAMPLE 102 | 50 | 0.6 | 55 | 103 | 800 |
| EXAMPLE 103 | 25 | 0.4 | 75 | 110 | 710 |
| COMPARATIVE EXAMPLE 101 | 500 | 0.8 | 10 | 78 | 860 |
| COMPARATIVE EXAMPLE 102 | 100 | 0.6 | 2 | 60 | 815 |
| COMPARATIVE EXAMPLE 103 | 100 | 4.0 | 3 | 56 | 640 |

The ratios of the crystal phases to the grain boundary phases in Table 1 can be obtained by the X-ray diffraction patterns of the sintered bodies. FIGS. 1(A), 1(B), 1(C), and 1(D) are X-ray diffraction diagrams of the sintered bodies according to Examples 103, 102, and 101 and Comparative Example 101, respectively.

Referring to these diagrams, an X-ray strength peak indicating an amount of $Si_3N_4$ and $Ho_2O_3$ present in the crystal compound, an X-ray strength peak B of the (101) plane of $\beta$-$Si_3N_4$, and an X-ray strength peak C of the (201) plane of $\beta$-$Si_3N_4$ appear. On the other hand, FIG. 1(E) is an X-ray diffraction diagram of a sintered body in which a grain boundary phase is amorphous, and a crystallizing ratio is zero. Referring to FIG. 1(E), no peak A corresponding to a crystal compound phase appears.

In this case, in a silicon nitride sintered body obtained by adding 12.5 wt % of $Ho_2O_3$ to silicon nitride, a crystallizing index Rs when a grain boundary phase is entirely crystallized is given by equation (1) described below where the X-ray strength values of the peaks A, B, and C are represented by IA, IB, and IC, respectively. The crystallizing index Rs is 0.45.

$$Rs=IC/(IA+IB)/2 \quad (1)$$

When the X-ray strength values of the peaks A, B, and C in the X-ray diffraction diagrams are read out, and the crystallizing indexes R of the respective sintered bodies of Examples 101 to 103 and Comparative Example 101 are calculated according to equation (1) described above, the following results can be obtained:

Example 102 . . . R=12.5/(77+95)/2=0.145
Example 103 . . . R=17/(62+74)/2=0.248
Example 104 . . . R=22/(55+75)/2=0.338
Comparative Example 101 . . . R=5/(106+118)/2=0.045

With respect to each crystallizing index R obtained as described above, as shown in Table 2 described below, the ratios to the crystallizing index Rs (=0.45) obtained when 100% of crystallization is performed are calculated, ratios Q of crystal phases to the grain boundary phases of the sintered body are calculated from equation (2) to be 32%, 55%, 75%, and 10%, respectively.

$$Q=(\%)=R/Rs \; 100 \quad (2)$$

As is apparent from the result shown in Table 1, in the silicon nitride sintered bodies according to Examples 101 to 103, a cooling rate of each sintered body immediately after sintering for high density was set to be lower than that of Comparative Example 101. For this reason, a grain boundary contained a crystal phase. As the ratio of crystal phase was high, a high-strength sintered body having high thermal conductivity and excellent heat radiation characteristics could be obtained.

In contrast, when the cooling rate of the sintered body was set to be high as in Comparative Example 101, and cooling was rapidly performed, the ratio of the crystal phase to the grain boundary phase was small, i.e., 10%, and its thermal conductivity decreased. As in Comparative Example 102, when the silicon nitride powder containing a total of 0.6 wt % of the impurity cation element was used, even if the cooling rate of the sintered body was set to be equal to that of Example 101, a large part of the grain boundary phase was amorphous, and thermal conductivity decreased.

As in Comparative Example 103, when a coarse silicon nitride powder having an average grain size of 1.2 $\mu$m was used, insufficient density was obtained in sintering, and strength and thermal conductivity decreased.

EXAMPLES 1 to 3

Five weight percents of a $Y_2O_3$ (yttrium oxide) powder having an average grain size of 0.7 $\mu$m serving as a sintering assistant and 1.0 wt % of an $Al_2O_3$ (alumina) powder having an average grain size of 0.5 $\mu$m serving as a sintering assistant were added to a silicon nitride source powder containing 1.3 wt % of oxygen and a total amount of 0.15 wt % of Li, Na, K, Fe, Ca, Mg, Sr, Ba, Mn, and B, and 97 wt % of $\alpha$-phase type silicon nitride and having an average grain size of 0.55 $\mu$m. The resultant mixture was wetly mixed in ethyl alcohol for 24 hours, and dried to prepare a source powder mixture.

A predetermined amount of an organic binder was added to the prepared source powder mixture, and uniformly mixed. The mixture was press-molded by a molding pressure of 1,000 kg/cm$^2$ to manufacture a large number of molded bodies. Each obtained molded body was degreased at 700° C. in an atmospheric gas for 2 hours. The degreased body was held at 1,900° C. and 9 atoms in a nitrogen gas atmosphere for 6 hours, and was sintered to be made dense. Thereafter, quantity of electricity to a heating apparatus arranged in a sintering furnace was controlled to cool sintered bodies such that cooling rates of the sintered bodies were adjusted to 100° C./hr until the temperature in the furnace decreased to 1,500° C. The obtained sintered bodies were polished to prepare silicon nitride substrates for Examples 1 to 3 each having a thermal conductivity k of 70 W/m K, respectively having thicknesses of 0.25 mm, 0.4 mm, and 0.6 mm, and each having a vertical dimension of 29 mm×a horizontal dimension of 63 mm. The ratio of the crystal phase to the grain boundary phase in each silicon nitride substrate was 30%, and the porosity of each substrate was 0.2%.

Figure 2:
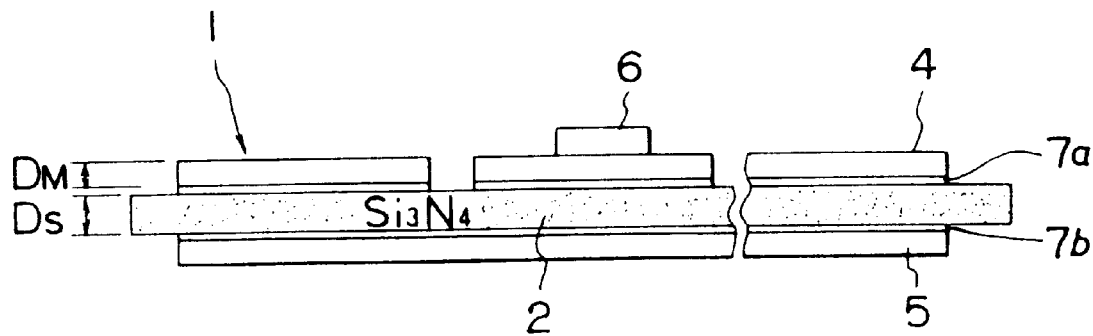
FIG. 2 is a sectional view showing a silicon nitride circuit board according to an embodiment of the present invention.

Then, as shown in FIG. 2, 30 wt % Ag-65 wt % Cu-5 wt % Ti soldering material was screen-printed on a portion where a circuit layer was formed on the surface of each silicon nitride substrate 2 and a portion where a copper plate was bonded to the rear surface of the silicon nitride substrate 2 and dried to form active metal soldering material layers 7a and 7b each having a thickness of 20 $\mu$m. A copper circuit plate 4 consisting of oxygen-free copper and having a thickness of 0.3 mm and a rear copper plate 5 having a thickness of 0.25 mm were arranged at predetermined positions of the active metal soldering material layers 7a and 7b to be in contact with the active metal soldering material layers 7a and 7b. The resultant structure was held at 850° C. in a vacuum state for 10 minutes to obtain a bonded body. Each bonded body was etched to form a predetermined circuit pattern (circuit layer). Then, a semiconductor element (output: 300 W) 6 having 16 mm square×0.5 mm thickness was bonded to the central portion of the copper circuit plate 4 by soldering to manufacture a large number of silicon nitride circuit boards 1 according to Examples 1 to 3.

EXAMPLE 4

The process was performed in the same manner as that of Example 3 except that a copper circuit plate having a thickness of 0.5 mm on the surface side and a rear copper plate having a thickness of 0.3 mm on the rear side were used in place of copper circuit plates having thicknesses of 0.3 mm and 0.25 mm used in Example 3, thereby preparing an $Si_3N_4$ circuit board according to Example 4.

EXAMPLE 5

The process was performed in the same manner as that of Example 2 except that a silicon nitride substrate having a thermal conductivity of 100 W/m K obtained by adjusting a cooling rate upon completion of sintering was in place of a high thermal conductive silicon nitride substrate having a thermal conductivity of 70 W/m K and used in Example 2, thereby preparing an $Si_3N_4$ circuit board according to Example 5.

Comparative Example 1

A copper circuit plate and a rear copper plate were integrally bonded to the surfaces of a substrate by the active metal method in the same manner as that of Example 3 except that an aluminum nitride (AlN) substrate having a thermal conductivity k of 170 W/m K and a thickness of 0.8 mm was used in place of the silicon nitride substrate having a thickness of 0.6 mm and used in Example 3, thereby manufacturing a circuit board according to Comparative Example 1.

Comparative Example 2

A copper circuit plate and a rear copper plate were integrally bonded to the surfaces of a substrate by the active metal brazing method in the same manner as that of Example 3 except that a silicon nitride substrate having a thickness of 0.8 mm was used in place of the silicon nitride substrate having a thickness of 0.6 mm used in Example 3, thereby manufacturing a circuit board according to Comparative Example 2.

The maximum deflections and anti-breaking strengths of the circuit board according to Examples 1 to 5 and Comparative Examples 1 and 2 which were prepared as described above were measured. As a result, it was found that the silicon nitride circuit boards 1 according to Examples 1 to 5 had maximum deflections and anti-breaking strengths which were twice or more those of the circuit board of Comparative Example 1 using a conventional aluminum nitride substrate. It was also confirmed that the deflection and anti-breaking strength were improved with a decrease in thickness of the silicon nitride substrate.

Figure 4:
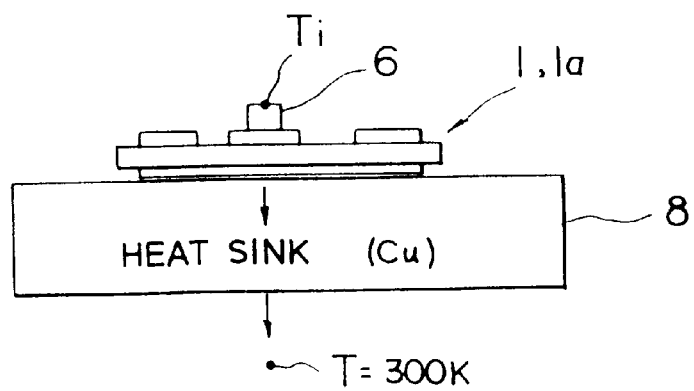
FIG. 4 is a sectional view showing a manner of a heat radiation characteristics evaluation test.

A heat radiation characteristics evaluation test was performed with respect to each circuit board. In the heat radiation characteristics evaluation test, as shown in FIG. 4, the circuit board 1 on which a semiconductor element 6 having an output of 300 W was mounted was bonded to a copper heat sink 8 having a heat radiation capacity of 109,000 $W/m^2$ K, and a surface temperature Ti of the semiconductor element 6 was measured with the semiconductor element 6 energized. A difference ($\Delta Ti=Ti-T$) between the surface temperature Ti and an outside temperature (T=300K) obtained the surface temperature Ti was in a stationary state, and the quality of heat radiation characteristics was evaluated on the basis of the magnitude of an increase in temperature ($\Delta Ti$) of the semiconductor element 6. Measurement values of the increase in temperature ($\Delta Ti$) are shown in Table 2.

As the result shown in Table 2, according to the circuit bored of each Example, although an $Si_3N_4$ substrate having a thermal conductivity lower than that of a conventional AlN substrate (Comparative Example 1) is used, since the thickness of the $Si_3N_4$ substrate can be decreased, the thermal conductivity of the overall circuit board can be reduced. Therefore, the increase in temperature Ti of the semiconductor element was almost equal to that of a conventional AlN circuit board, and it was also found that the circuit board exhibited excellent heat radiation characteristics. Since the heat resistance decreased by reducing the thickness of the $Si_3N_4$ substrate, it was also confirmed that the heat radiation characteristics of the overall circuit board could be improved.

On the other hand, in Comparative Example 2 using the $Si_3N_4$ substrate having a thickness of 0.8 mm which was larger than twice the thickness of the metal circuit plate, the increase in temperature Ti of the semiconductor element was large, and it was confirmed the heat radiation characteristics were relatively poor.

When the circuit boards of Examples described above were mounted on boards by clamping in the assembly step, clamping cracks were not formed at all, and semiconductor devices using the circuit boards could be mass-produced at a high production yield.

An increase temperature-decrease temperature cycle having one cycle in which heating from −45° C. to room temperature (RT), heating from room temperature to +125° C., and cooling from +125° C. to −45° C. through room temperature were performed to the circuit boards was repeated, and the number of cycles performed until cracks or the like were formed in the substrate portions was measured, thereby performing a heat cycle resistance test.

As the result, in case of the circuit boards of Examples 1 to 5, even after 1,000 cycles were performed, no cracks were formed in the $Si_3N_4$ substrates, and the metal circuit plates (Cu circuit plates) were not peeled. Therefore, it was found that the circuit boards exhibited excellent heat cycle resistance characteristics. On the other hand, in case of the AlN circuit board of Comparative Example 1, cracks were formed after 100 cycles were performed, and it was confirmed that the circuit board had poor durability.

EXAMPLES 6 to 10

A metal circuit plate was integrally bonded to an $Si_3N_4$ substrate by a copper direct bonding method (DBC method) in place of the active metal brazing method, and $Si_3N_4$ substrates according to Examples 6 to 10 corresponding to Example 1 to 5, respectively were manufactured in the following manner.

More specifically, the $Si_3N_4$ substrates prepared in Examples 1 to 5, each having a thermal conductivity k of 70 or 100 W/m K, and respectively having 0.25 mm, 0.4 mm, 0.6 mm, and 0.8 mm were heated at a temperature of 1,300° C. in an oxidizing furnace for 12 hours to oxidize the entire surfaces of the substrates, thereby forming oxide layers each having a thickness of 2 μm. The oxide layers were constituted by $SiO_2$ films.

A copper circuit plate having a thickness of 0.3 mm or 0.5 mm and consisting of tough pitch electrolytic copper was arranged to be in contact with the front surface side of each $Si_3N_4$ substrate on which the oxide layer was formed as shown in Table 2, and a copper circuit plate having a thickness of 0.25 mm or 0.3 mm and consisting of tough pitch electrolytic copper was arranged to be in contact with the rear surface side of the $Si_3N_4$ substrate as a backing material, thereby forming an assembled body.

Then, the assembled body was inserted into a heating furnace having a temperature of 1,075° C. and an atmosphere adjusted to a nitrogen gas atmosphere, and heated for 1 minute, thereby directly bonding the copper circuit plates to both the surfaces of each $Si_3N_4$ substrate. Subsequently, a semiconductor element was bonded to the copper circuit plate by soldering, thereby preparing $Si_3N_4$ circuit boards according to Examples 6 to 10.

Figure 3:
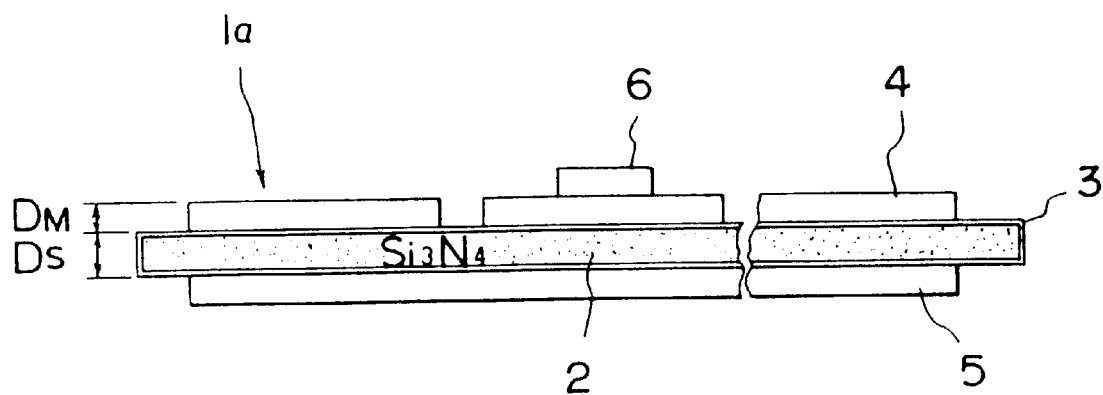
FIG. 3 is a sectional view showing a silicon nitride circuit board according to another embodiment of the present invention.

Each $Si_3N_4$ circuit board 1*a* has the following structure. That is, as shown in FIG. 3, an oxide layer 3 consisting of $SiO_2$ is formed on the entire surface of an $Si_3N_4$ substrate 2, and a copper circuit plate 4 serving as a metal circuit plate is directly bonded to the front surface side of the $Si_3N_4$ substrate 2, and a copper circuit plate 5 serving as a rear copper plate is directly bonded to the rear surface side as in the same manner as described above. A semiconductor element 6 is integrally bonded at a predetermined position of the copper circuit plate 4 on the front surface side through a soldering layer (not shown). When the copper circuit plates 4 and 5 are bonded to both the surfaces of the $Si_3N_4$ substrate 2, the copper circuit plate 5 serving as a rear copper plate effectively contributes to acceleration of heat radiation and prevention of warpage of the circuit board.

The maximum deflections of the $Si_3N_4$ circuit boards according to Examples 6 to 10 in which circuit layers were formed by the direct bonding method as described above fell within the range of 0.8 to 1.6 mm, and anti-breaking strengths fell within the range of 550 to 900 MPa. As a result, the characteristic values almost equal to those obtained when a circuit layer was formed by the active metal brazing method as in Examples 1 to 5 could be obtained. In a heat cycle resistance test, the following excellent heat cycle resistance exhibited. That is, even after 1,000 cycles were performed, no cracks were formed in the $Si_3N_4$ substrate, and the metal circuit plate was not peeled at all.

Comparative Example 3

A copper circuit plate and a rear copper plate were integrally bonded to the surfaces of a substrate by a copper direction bonding method in the same manner as that of Example 8 except that an aluminum nitride (AlN) substrate having a thermal conductivity k of 170 W/m K and a thickness of 0.8 mm was used in place of the silicon nitride substrate used in Example 8, thereby manufacturing a circuit board according to Comparative Example 3.

Comparative Example 4

A copper circuit plate and a rear copper plate were integrally bonded to the surfaces of a substrate by a copper direct bonding method in the same manner as that of Example 8 except that a silicon nitride substrate having a thickness of 0.8 mm was used in place of the silicon nitride substrate having a thickness of 0.6 mm and used in Example 8, thereby manufacturing a circuit board according to Comparative Example 4.

Figure 5:
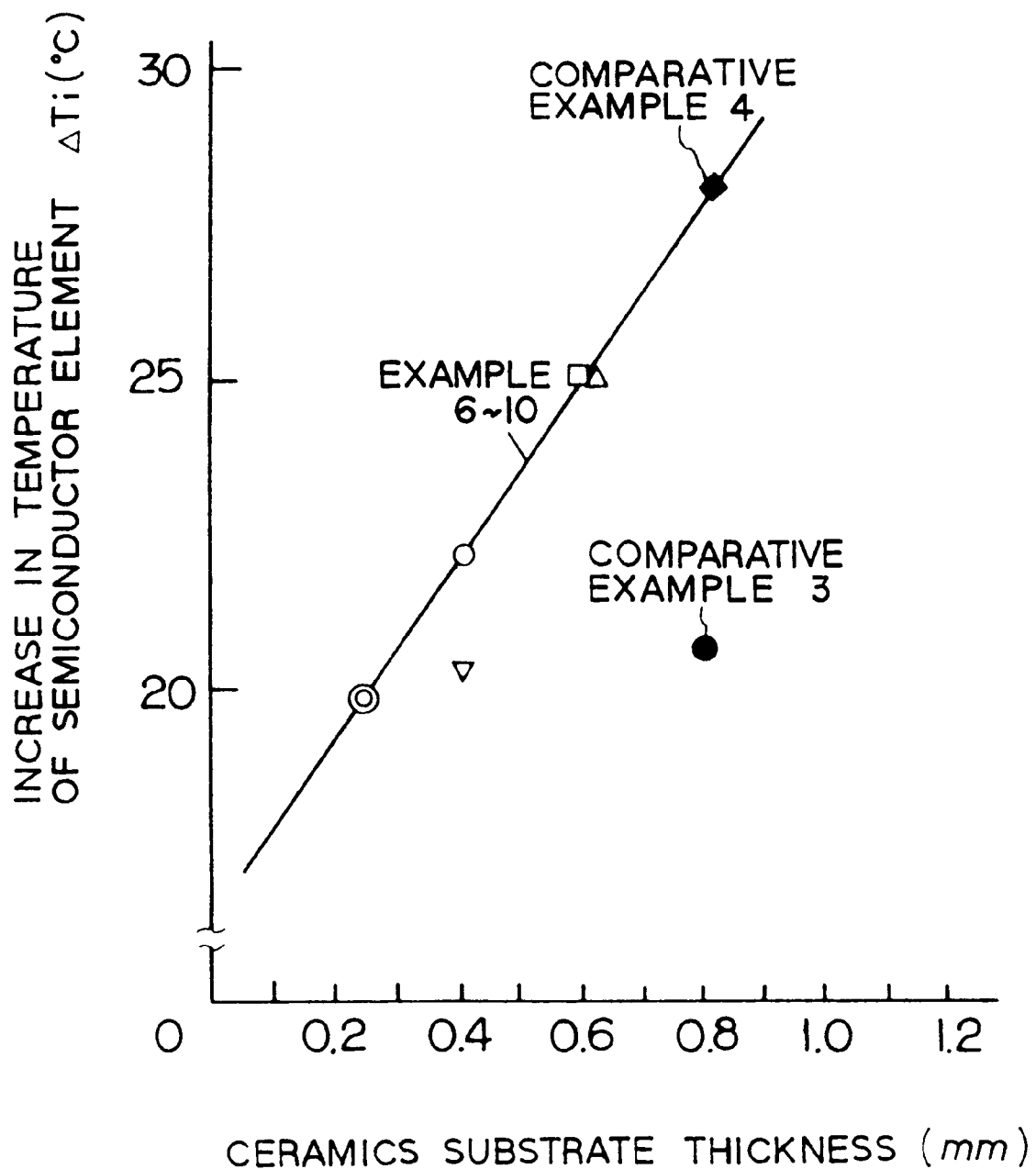
FIG. 5 is a graph showing the relationship between a ceramic substrate thickness and an increase in temperature of a semiconductor element in the heat radiation evaluation test.

The heat radiation characteristics evaluation test shown in FIG. 4 was performed with respect to the circuit boards according to Examples 6 to 10 and Comparative Example 3 to 4 manufactured as described above in the same manner as in Examples 1 to 5 and Comparative Examples 1 and 2, and an increase in temperature ΔTi caused by heat generated by a semiconductor element having an output of 300 W was measured, thereby obtaining the result shown in Table 2. The relationship between the thickness of a ceramic substrate such as a silicon nitride substrate and the increase in temperature ΔTi of the semiconductor element is shown in FIG. 5 as a graph.

TABLE 2

| Sample No. | SYMBOL | CERAMIC SUBSTRATE | | | | THICKNESS OF METAL CIRCUIT PLATE $D_M$(mm) | | BONDING METHOD OF METAL CIRCUIT PLATE | HEAT RADIATION CHARACTERISTICS OF CIRCUIT BOARD IN-CREASE IN TEMPERATURE OF SEMICONDUCTOR ELEMENT ΔTi(° C.) |
|---|---|---|---|---|---|---|---|---|---|
| | | TYPE | THICKNESS $D_S$(mm) | THERMAL CONDUCTIVITY (W/m · K) | THREE-POINT BENDING STRENGTH (MPa) | SURFACE SIDE (FOR CIRCUIT LAYER) | REAR SIDE (REAR COPPER PLATE) | | |
| EXAMPLE 1 | | $Si_3N_4$ | 0.25 | 70 | 860 | 0.3 | 0.25 | ACTIVE METAL METHOD | 21.3 |
| EXAMPLE 2 | | $Si_3N_4$ | 0.4 | 70 | 860 | 0.3 | 0.25 | ACTIVE METAL METHOD | 24.1 |
| EXAMPLE 3 | | $Si_3N_4$ | 0.6 | 70 | 860 | 0.3 | 0.25 | ACTIVE METAL METHOD | 26.5 |
| EXAMPLE 4 | | $Si_3N_4$ | 0.6 | 70 | 860 | 0.5 | 0.3 | ACTIVE METAL METHOD | 26.5 |
| EXAMPLE 5 | | $Si_3N_4$ | 0.4 | 100 | 840 | 0.3 | 0.25 | ACTIVE METAL METHOD | 21.2 |
| COMPARATIVE EXAMPLE 1 | | AlN | 0.8 | 170 | 270 | 0.3 | 0.25 | ACTIVE METAL METHOD | 21.5 |
| COMPARATIVE | | $Si_3N_4$ | 0.8 | 70 | 860 | 0.3 | 0.25 | COPPER DIRECT BONDING METHOD | 29.8 |

TABLE 2-continued

| Sample No. | SYMBOL | CERAMIC SUBSTRATE | | | | THICKNESS OF METAL CIRCUIT PLATE D_M(mm) | | BONDING METHOD OF METAL CIRCUIT PLATE | HEAT RADIATION CHARACTERISTICS OF CIRCUIT BOARD INCREASE IN TEMPERATURE OF SEMICONDUCTOR ELEMENT ΔTi(° C.) |
|---|---|---|---|---|---|---|---|---|---|
| | | TYPE | THICKNESS $D_S$(mm) | THERMAL CONDUCTIVITY (W/m·K) | THREE-POINT BENDING STRENGTH (MPa) | SURFACE SIDE (FOR CIRCUIT LAYER) | REAR SIDE (REAR COPPER PLATE) | | |
| EXAMPLE 2 | | | | | | | | | |
| EXAMPLE 6 | ◉ | Si₃N₄ | 0.25 | 70 | 860 | 0.3 | 0.25 | COPPER DIRECT BONDING METHOD | 19.9 |
| EXAMPLE 7 | ○ | Si₃N₄ | 0.4 | 70 | 860 | 0.3 | 0.25 | COPPER DIRECT BONDING METHOD | 22.2 |
| EXAMPLE 8 | □ | Si₃N₄ | 0.6 | 70 | 860 | 0.3 | 0.25 | COPPER DIRECT BONDING METHOD | 25.2 |
| EXAMPLE 9 | Δ | Si₃N₄ | 0.6 | 70 | 860 | 0.5 | 0.3 | COPPER DIRECT BONDING METHOD | 25.2 |
| EXAMPLE 10 | ▽ | Si₃N₄ | 0.4 | 100 | 840 | 0.3 | 0.25 | COPPER DIRECT BONDING METHOD | 20.3 |
| COMPARATIVE EXAMPLE 3 | ● | AlN | 0.8 | 170 | 270 | 0.3 | 0.25 | COPPER DIRECT BONDING METHOD | 20.7 |
| COMPARATIVE EXAMPLE 4 | ◆ | Si₃N₄ | 0.8 | 70 | 860 | 0.3 | 0.25 | COPPER DIRECT BONDING METHOD | 28.1 |

As is apparent from the results shown in Table 2 and FIG. 5, the following could be confirmed. That is, with a decrease in thickness of the silicon nitride substrate, the heat resistance of the overall circuit board decreased, and the increase in temperature ΔTi of the semiconductor element linearly decreased, thereby improving the heat radiation characteristics.

In particular, as is apparent from comparison among Example 6 (◉), Example 10 (▼), and Comparative Example 3 (●), when a circuit board was formed by using an Si₃N₄ substrate having a thermal conductivity of 70 W/mK K and a thickness of 0.25 mm or an Si₃N₄ substrate having a thermal conductivity of 100 W/m·K and a thickness of 0.4 mm, heat radiation characteristics equal to those of the circuit substrate formed by using an AlN substrate having a heat conductivity of 170 W/m K and a thickness of 0.8 mm. Therefore, the substrate thickness can be decreased to ½ or less the conventional substrate thickness, and the production cost of the substrate can be reduced.

When each Si₃N₄ substrate was decreased in thickness, preferable dielectric breakdown strength can be obtained, and it was found that dielectric breakdown strength equal to or higher then conventional dielectric breakdown strength could be held. On the other hand, in Comparative Example 4 using the Si₃N₄ substrate having a thickness of 0.8 mm which was larger than twice the thickness of the metal circuit plate, it was found that the increase in temperature ΔTi of the semiconductor element was large, and heat radiation characteristics were relatively poor.

Influence of the thickness of the silicon nitride substrate used in the present invention to the deflection or antibreaking strength of the circuit board will be described below with reference to Examples described below.

EXAMPLES 11 to 13

Five weight percents of a Y₂O₃ (yttrium oxide) powder having an average grain size of 0.7 μm serving as a sintering assistant and 1.5 wt % of an Al₂O₃ (alumina) powder having an average grain size of 0.5 μm serving as a sintering assistant were added to a silicon nitride source powder containing 1.3 wt % of oxygen and a total amount of 0.15 wt % of the impurity cation elements described above, and 97 wt % of α-phase type silicon nitride and having an average grain size of 0.55 μm. The resultant mixture was wetly mixed in ethyl alcohol for 24 hours, and dried to prepare a source powder mixture.

A predetermined amount of an organic binder was added to the prepared source powder mixture, and uniformly mixed. The mixture was press-molded by a molding pressure of 1,000 kg/cm² to manufacture a large number of molded bodies each having a length of 80 mm×a width of 50 mm×a thickness of 1 to 5 mm. Each obtained molded body was degreased at 700° C. in an atmospheric gas for 2 hours. The degreased body was held at 1,900° C. and 9 atoms in a nitrogen gas atmosphere for 6 hours, and was sintered to be made dense. Thereafter, quantity of electricity to a heating apparatus arranged in a sintering furnace was controlled to cool sintered bodies such that cooling rates of the sintered bodies were adjusted to 100° C./hr until the temperature in the furnace decreased to 1,500° C. The obtained sintered bodies were polished to prepare silicon nitride substrates for Examples 11 to 13 each having a thermal conductivity k of 70 W/m K, respectively having thicknesses of 0.4 mm, 0.6 mm, and 0.8 mm.

Figure 6:
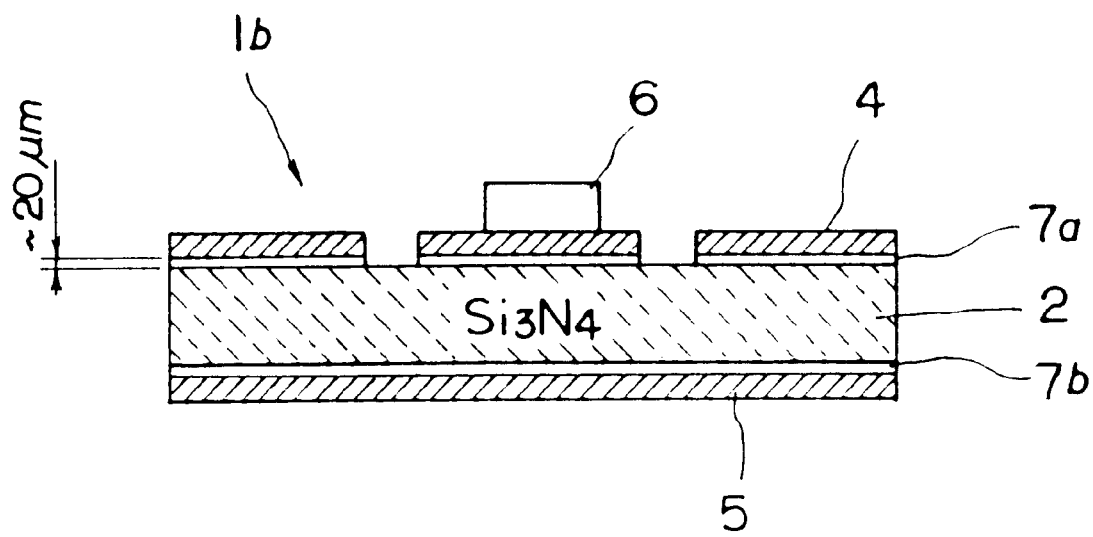
FIG. 6 is a sectional view showing an arrangement of a silicon nitride circuit board according the present invention.

Then, as shown in FIG. 6, a soldering material having a composition of 30 wt % Ag-65 wt % Cu-5 wt % Ti was screen-printed on a portion where a circuit layer was formed on the surface of each silicon nitride substrate 2 and a portion where a copper plate was bonded to the rear surface of the silicon nitride substrate 2 and dried to form active metal soldering material layers 7a and 7b each having a thickness of 20 μm.

Then, a copper circuit plate 4 consisting of tough pitch electrolytic copper and having a thickness of 0.3 mm and a rear copper plate 5 having a thickness of 0.25 mm were arranged at predetermined positions of the active metal soldering material layers 7a and 7b to be in contact with the active metal soldering material layers 7a and 7b. The resultant structure was held at 850° C. in a vacuum state for 10 minutes to obtain a bonded body. Each bonded body was etched to form a predetermined circuit pattern. Subsequently, a semiconductor element 6 was bonded to the central portion of the copper circuit plate 4 by soldering to manufacture a large number of silicon nitride circuit boards 1b according to Examples 1 to 3.

Comparative Example 5

A copper circuit plate and a rear copper plate were integrally bonded to the surfaces of a substrate by an active metal brazing method in the same manner as that of Examples 11 to 13 except that an aluminum nitride (AlN) substrate having a thermal conductivity k of 70 W/m K and a thickness of 0.8 mm was used in place of the silicon nitride substrate used in Examples 11 to 13, thereby manufacturing a circuit board according to Comparative Example 5.

Figure 7:
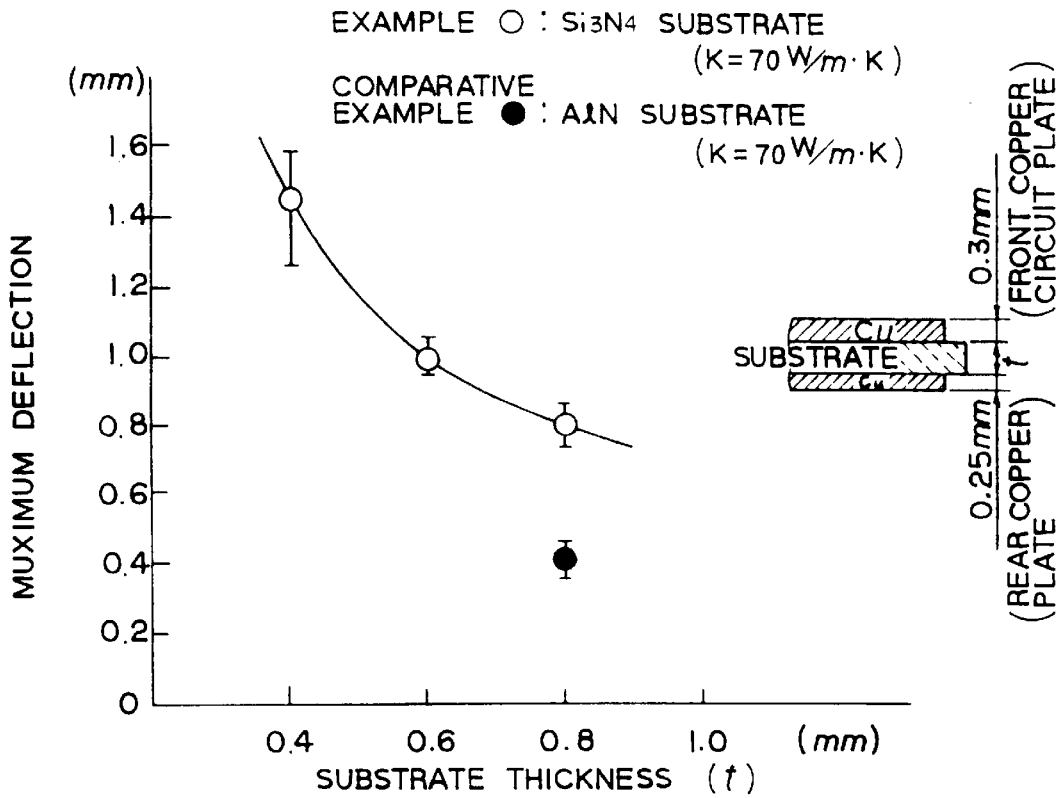
FIG. 7 is a graph showing the relationship between a substrate thickness and the maximum deflection.
Figure 8:
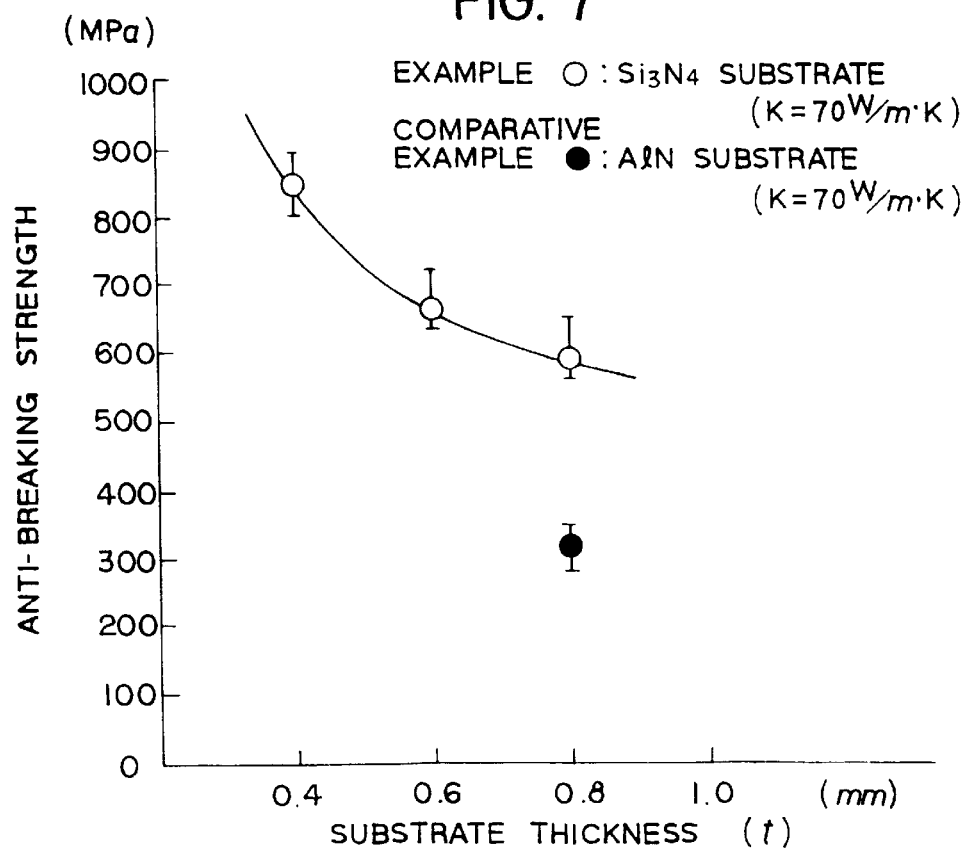
FIG. 8 is a graph showing the relationship between the substrate thickness and an anti-breaking strength.

The maximum deflections and anti-breaking strengths of the circuit board according to Examples 11 to 13 and Comparative Example 5 which were prepared as described above were measured, thereby obtaining the results shown in FIGS. 7 and 8. In this case, the maximum deflection was measured as a maximum deflection height obtained such that a load is applied on the central portion of each circuit board with the circuit board supported at a support span of 50 mm, and the $Si_3N_4$ substrate or the AlN substrate were broken. The anti-breaking strength was calculated on the basis of the sectional area of the substrate and a load when the substrate was broken.

As is apparent from the results shown in FIGS. 7 and 8, it was found that the silicon nitride circuit boards 1b according to Examples 11 to 13 had maximum deflections and anti-breaking strengths which were twice or more those of the circuit board of Comparative Example 5 using a conventional aluminum nitride substrate. It was also confirmed that the deflection and anti-breaking strength were improved with a decrease in thickness of the silicon nitride substrate. Since the heat resistance decreased by reducing the thickness of the substrate, it was also confirmed that the heat radiation characteristics of the overall circuit board could be more improved.

When the circuit boards described above were mounted and clamped on boards in the assembly step, clamping cracks were not formed, and semiconductor devices using the circuit boards could be mass-produced at a high production yield.

An increase temperature-decrease temperature cycle having one cycle in which heating from −45° C. to room temperature (RT), heating from room temperature to +125° C., and cooling from +125° C. to −45° C. through room temperature were performed to the circuit boards was repeated, and the number of cycles performed until cracks or the like were formed in the substrate portions was measured, thereby performing a heat cycle resistance test. In this case, in case of the circuit boards of Examples 11 to 13, after 1,000 cycles were performed, no cracks were formed in the $Si_3N_4$ substrates, and the metal circuit plates (Cu circuit plates) were not peeled. Therefore, it was found that the circuit boards exhibited excellent heat cycle resistance characteristics. On the other hand, in the AlN circuit board of Comparative Example 5, cracks were formed after 100 cycles were performed, and it was confirmed that the circuit board had poor durability.

Example 14

The $Si_3N_4$ substrates prepared in Examples 11 to 13, each having a thermal conductivity k of 70 W/m K, and respectively having 0.4 mm, 0.6 mm, and 0.8 mm were heated at a temperature of 1,300° C. in an oxidizing furnace for 12 hours to oxidize the entire surfaces of the substrates, thereby forming oxide layers each having a thickness of 2 μm.

Figure 9:
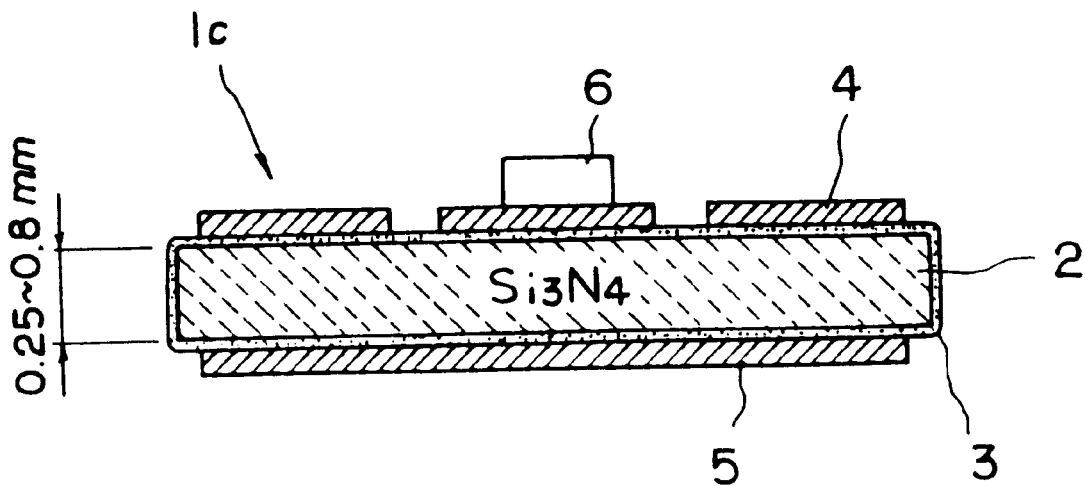
FIG. 9 is a sectional view showing a circuit board in which a circuit layer is formed by a copper direct bonding method.

A copper circuit plate having a thickness of 0.3 mm and consisting of tough pitch electrolytic copper was arranged to be in contact with the front surface side of each $Si_3N_4$ substrate on which the oxide layer was formed, and a copper circuit plate having a thickness of 0.25 mm and consisting of tough pitch electrolytic copper was arranged to be in contact with the rear surface side of the $Si_3N_4$ substrate as a backing material, thereby forming an assembled body. The assembled body was then inserted into a heating furnace having a temperature of 1,075° C. and an atmosphere adjusted to a nitrogen gas atmosphere, and heated for 1 minute, thereby preparing $Si_3N_4$ circuit boards according to Example 14 in which copper circuit plates were directly bonded to both the surfaces of each $Si_3N_4$ substrate as shown in FIG. 9.

Each $Si_3N_4$ circuit board 1c has the following structure. That is, as shown in FIG. 9, an oxide layer 3 is formed on the entire surface of the $Si_3N_4$ substrate 2, and a copper circuit plate 4 serving as a metal circuit plate is directly bonded to the front surface side of the $Si_3N_4$ substrate 2, and a copper circuit plate 5 serving as a rear copper plate is directly bonded to the rear surface side as in the same manner as described above. A semiconductor element 6 is integrally bonded at a predetermined position of the copper circuit plate 4 on the front surface side through a soldering layer (not shown). When the copper circuit plates 4 and 5 are bonded to both the surfaces of the $Si_3N_4$ substrate 2, the copper circuit plate 5 serving as a rear copper plate effectively contributes to acceleration of heat radiation and prevention of warpage.

The maximum deflection of the $Si_3N_4$ circuit board according to Example 14 in which a circuit layer was formed by the direct bonding method as described above fell within the range of 0.8 to 1.6 mm, and anti-braking strengths fell within the range of 550 to 900 MPa. As a result, the characteristic values almost equal to those obtained when a circuit layer was formed by the active metal brazing method as in Examples 1 to 5 could be obtained. In a heat cycle resistance test, the following excellent heat cycle resistance exhibited. That is, even after 1,000 cycles were performed, no cracks were formed in the $Si_3N_4$ substrate, and no metal circuit plate was peeled.

EXAMPLE 15

Figure 10:
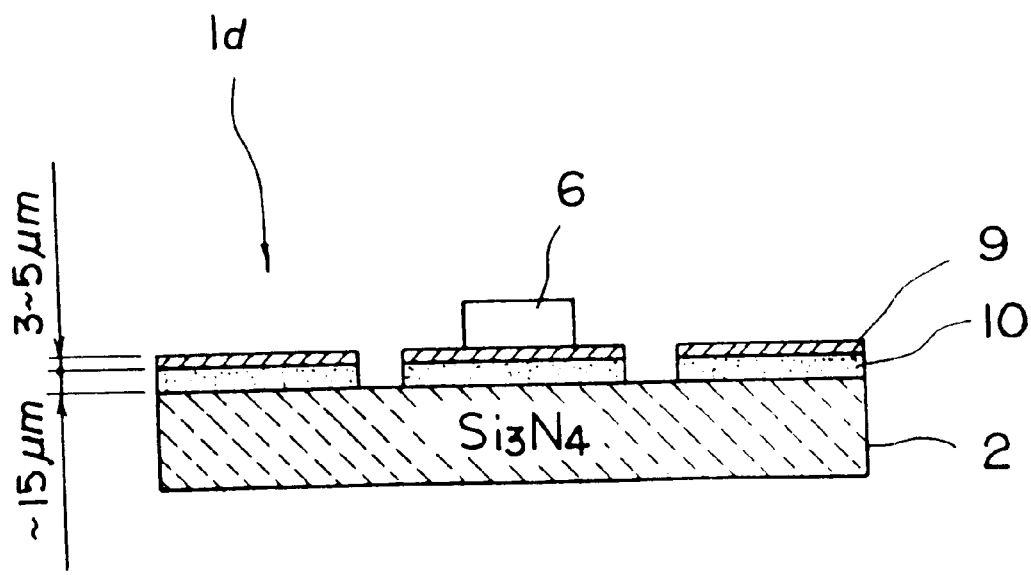
FIG. 10 is a sectional view showing a circuit board in which a circuit layer is formed by a metalize method.

As shown in FIG. 10, a paste obtained by adding a proper amount of binder and a solvent to a powder mixture of molybdenum (Mo) and titanium oxide ($TiO_2$) was screen-printed on the surfaces of the $Si_3N_4$ substrates 2 prepared in Examples 11 to 13, each having a thermal conductivity of 70 W/m K, and respectively having thicknesses of 0.4 mm, 0.6 mm, and 0.8 mm, and was heated and sintered to form refractory metal metalized layers 10 each having a thickness of 15 $\mu$m. An Ni-plating layer 9 having a thickness of 3 $\mu$m was formed by electroless plating on each metalized layer 10 to form a circuit layer having a predetermined pattern. A semiconductor element 6 was bonded to the circuit layer by soldering, thereby manufacturing a large number of silicon nitride circuit boards 1d according to Example 15.

The maximum deflection of the $Si_3N_4$ circuit board according to Example 15 in which a circuit layer was formed by the metalize method as described above fell within the range of 1.0 to 1.8 mm, and anti-braking strengths fell within the range of 650 to 950 MPa. As a result, the characteristic values almost equal to those obtained when a circuit layer was formed by the active metal brazing method as in Examples 11 to 13 could be obtained. In a heat cycle resistance test, the following excellent heat cycle resistance exhibited. That is, even after 1,000 cycles were performed, no cracks were formed in the $Si_3N_4$ substrate, and no metal circuit plate was peeled.

An embodiment of a circuit board using other silicon nitride substrates having various components and various characteristic values will be described below with reference to Example 16.

and an AlN powder, were added to a silicon nitride source powder containing 1.3 wt % of oxygen, a total amount of 0.15 wt % of the impurity cation element, and 97 wt % of $\alpha$-phase type silicon and having an average grain size of 0.55 $\mu$m. The resultant mixture was wetly mixed in ethyl alcohol using silicon nitride balls for 72 hours, and dried to prepare a source powder mixture. A predetermined amount of an organic binder was added to each prepared source powder mixture, and uniformly mixed. The mixture was then press-molded by a molding pressure of 1,000 kg/cm$^2$ to manufacture a large number of molded bodies having various compositions.

Each obtained molded body was degreased at 700° C. in an atmospheric gas for 2 hours. The degreased body was held at 1,950° C. and 9 atoms in a nitrogen gas atmosphere for 6 hours, and was sintered to be made dense. Thereafter, quantity of electricity to a heating apparatus arranged in a sintering furnace was controlled to cool sintered bodies such that cooling rates of the sintered bodies were adjusted to be values shown in Tables 3 to 5, until the temperature in the furnace decreased to 1,500° C. Silicon nitride sintered bodies according to Samples 1 to 51 were prepared.

TABLE 3

| SAMPLE | SOURCE COMPOSTION (WEIGHT %) | | SINTERING CONDITION TEMPERATURER × TIME (° C.) × (hr) | COOLING RATE TO 1500° C. AFTER SINTERING (° C./hr) | POROSITY (%) | RATIO OF CRYSTAL PHASE TO GRAIN BOUNDARY PHASE (%) | THERMAL CONDUCT-IVITY (W/m · K) | THREE-POINT BENDING STRENGTH (MPa) |
|---|---|---|---|---|---|---|---|---|
| | $Si_3N_4$ | $Ho_2O_3$ | | | | | | |
| 1 | 92 | 8 | 1950 × 6 | 100 | 0.2 | 22 | 89 | 845 |
| 2 | 92 | 8 | 1950 × 6 | 50 | 0.1 | 28 | 92 | 820 |
| 3 | 92 | 8 | 1900 × 6 | 50 | 0.6 | 34 | 95 | 800 |
| 4 | 90 | 10 | 1950 × 6 | 100 | 0.5 | 25 | 95 | 820 |
| 5 | 90 | 10 | 1950 × 6 | 25 | 0.3 | 65 | 99 | 705 |
| 6 | 90 | 10 | 1900 × 6 | 25 | 0.9 | 67 | 104 | 805 |
| 7 | 87.5 | 12.5 | 1975 × 6 | 50 | 0.4 | 69 | 114 | 760 |
| 8 | 87.5 | 12.5 | 1900 × 6 | 25 | 1.2 | 70 | 105 | 795 |
| 9 | 85 | 15 | 1950 × 6 | 100 | 1.2 | 40 | 102 | 780 |
| 10 | 85 | 15 | 2000 × 6 | 100 | 0.6 | 35 | 108 | 700 |
| 11 | 85 | 15 | 1950 × 6 | 25 | 1.0 | 65 | 120 | 730 |
| 12 | 82.5 | 17.5 | 1950 × 6 | 100 | 2.3 | 30 | 90 | 755 |
| 13 | 82.5 | 17.5 | 2000 × 6 | 100 | 1.8 | 28 | 96 | 700 |
| 14 | 82.5 | 17.5 | 2000 × 6 | 25 | 1.4 | 32 | 100 | 680 |

EXAMPLE 16

Various silicon nitride substrates serving as materials constituting a circuit board were manufactured by the following procedures.

More specifically, as shown in Tables 3 to 5, rare earth oxides such as $Y_2O_3$ and $Ho_2O_3$ serving as sintering assistants and, if necessary, Ti, Hf compound, an $Al_2O_3$ powder, The average values of the porosities, heat conductivities (at 25° C.), and three-point bending strengths at room temperature were measured with respect to the silicon nitride sintered bodies according to Samples 1 to 51 obtained as described above. The ratio of a crystal phase to a grain boundary phase was measured by an X-ray diffraction method with respect to each sintered body, and the results shown in Tables 3 to 5 described below was obtained.

TABLE 4

| SAMPLE | SOURCE COMPOSTION (WEIGHT %) | | | | | SINTERING CONDITION TEMPERATURER × TIME (° C.) × (hr) | COOLING RATE TO 1500° C. AFTER SINTERING (° C./hr) |
|---|---|---|---|---|---|---|---|
| | $Si_3N_4$ | $Y_2O_3$ | OTHER COMPONENT | $Al_2O_3$ | AlN | | |
| 15 | 94.8 | 5 | $HfO_2$ | 0.2 | | 1900 × 6 | 50 |
| 16 | 94 | 5 | $HfO_2$ | 1 | | 1900 × 6 | 50 |
| 17 | 92 | 5 | $HfO_2$ | 3 | | 1900 × 6 | 50 |
| 18 | 95 | 2 | $HfO_2$ | 3 | | 1900 × 6 | 50 |
| 19 | 92 | 7.5 | $HfO_2$ | 0.5 | | 1900 × 6 | 50 |
| 20 | 94 | 5 | $HfO_2$ | 1 | | 1900 × 6 | 100 |
| 21 | 94 | 5 | HfC | 1 | | 1900 × 6 | 100 |
| 22 | 94 | 5 | HfN | 1 | | 1950 × 6 | 100 |
| 23 | 94 | 5 | $HfSi_2$ | 1 | | 1950 × 6 | 100 |
| 24 | 94 | 5 | $HfB_2$ | 1 | | 1900 × 6 | 100 |
| 25 | 94 | 5 | $TiO_2$ | 1 | | 1900 × 6 | 100 |
| 26 | 94 | 5 | $ZrO_2$ | 1 | | 1900 × 6 | 100 |
| 27 | 94 | 5 | $V_2O_5$ | 1 | | 1900 × 6 | 100 |
| 28 | 94 | 5 | $Nb_2O_5$ | 1 | | 1900 × 6 | 100 |
| 29 | 94 | 5 | $Ta_2O_5$ | 1 | | 1900 × 6 | 100 |
| 30 | 94 | 5 | $Cr_2O_3$ | 1 | | 1900 × 6 | 100 |
| 31 | 94 | 5 | $MoO_3$ | 1 | | 1900 × 6 | 100 |
| 32 | 94 | 5 | $WO_3$ | 1 | | 1900 × 6 | 100 |
| 33 | 94 | 5 | TiC | 1 | | 1900 × 6 | 100 |
| 34 | 94 | 5 | WC | 1 | | 1900 × 6 | 100 |
| 35 | 94 | 5 | $TiB_2$ | 1 | | 1900 × 6 | 100 |
| 36 | 94 | 5 | HfO2 | 0.5 | | 1900 × 6 | 100 |
| | | | $TiO_2$ | 0.5 | | | |

| SAMPLE | POROSITY (%) | RATIO OF CRYSTAL PHASE TO GRAIN BOUNDARY PHASE (%) | THERMAL CONDUCTIVITY (W/m · K) | THREE-POINT BENDING STRENGTH (MPa) |
|---|---|---|---|---|
| 15 | 1.3 | 50 | 88 | 840 |
| 16 | 0.2 | 55 | 90 | 960 |
| 17 | 0.1 | 45 | 75 | 1060 |
| 18 | 0.5 | 30 | 65 | 930 |
| 19 | 0.1 | 75 | 95 | 870 |
| 20 | 0.2 | 45 | 80 | 980 |
| 21 | 0.3 | 55 | 92 | 960 |
| 22 | 0.4 | 55 | 90 | 930 |
| 23 | 0.4 | 50 | 88 | 910 |
| 24 | 0.4 | 45 | 83 | 880 |
| 25 | 0.2 | 48 | 80 | 960 |
| 26 | 0.2 | 45 | 85 | 1030 |
| 27 | 0.3 | 50 | 90 | 930 |
| 28 | 0.2 | 48 | 83 | 880 |
| 29 | 0.4 | 45 | 80 | 900 |
| 30 | 0.2 | 58 | 100 | 930 |
| 31 | 0.4 | 40 | 75 | 910 |
| 32 | 0.3 | 40 | 75 | 880 |
| 33 | 0.4 | 59 | 95 | 930 |
| 34 | 0.3 | 49 | 83 | 910 |
| 35 | 0.4 | 40 | 80 | 950 |
| 36 | 0.2 | 46 | 82 | 1000 |

TABLE 5

| SAMPLE | SOURCE COMPOSTION (WEIGHT %) | | | | | SINTERING CONDITION TEMPERATURER × TIME (° C.) × (hr) | COOLING RATE TO 1500° C. AFTER SINTERING (° C./hr) |
|---|---|---|---|---|---|---|---|
| | $Si_3N_4$ | RARE EARTH OXIDE | OTHER COMPONENT | $Al_2O_3$ | AlN | | |
| 37 | 88 | $Ho_2O_3$ 6.5 $Y_2O_3$ 3.5 | $HfO_2$ 2 | | | 1900 × 6 | 50 |
| 38 | 88 | $Er_2O_3$ 6.5 $Y_2O_3$ 3.5 | $HfO_2$ 2 | | | 1900 × 6 | 50 |
| 39 | 88 | $Yb_2O_3$ 6.5 $Y_2O_3$ 3.5 | $HfO_2$ 2 | | | 1900 × 6 | 50 |
| 40 | 83.9 | $Ho_2O_3$ 15 | $HfO_2$ 1 | 0.1 | | 1900 × 6 | 50 |
| 41 | 84 | $Ho_2O_3$ 15 | $HfO_2$ 0.5 | 0.5 | | 1900 × 6 | 50 |
| 42 | 82 | $Ho_2O_3$ 15 | $HfO_2$ 2 | 1 | | 1850 × 6 | 25 |
| 43 | 82.5 | $Ho_2O_3$ 15 | $HfO_2$ 2 | | 0.5 | 1900 × 6 | 50 |
| 44 | 83 | $Ho_2O_3$ 15 | $HfO_2$ 2 | | 1 | 1900 × 6 | 50 |
| 45 | 82.6 | $Ho_2O_3$ 15 | $HfO_2$ 2 | 0.2 | 0.2 | 1900 × 6 | 50 |
| 46 | 82.5 | $Er_2O_3$ 15 | $HfO_2$ 2 | 0.5 | | 1900 × 6 | 50 |
| 47 | 82.5 | $Er_2O_3$ 15 | $HfO_2$ 2 | | 0.5 | 1900 × 6 | 50 |
| 48 | 89.8 | $Y_2O_3$ 8 | $HfO_2$ 2 | 0.2 | | 1900 × 6 | 50 |
| 49 | 84 | $Ho_2O_3$ 15 | $TiO_2$ 0.5 | 0.5 | | 1900 × 6 | 50 |
| 50 | 84 | $Er_2O_3$ 15 | $TiO_2$ 0.5 | 0.5 | | 1900 × 6 | 50 |
| 51 | 84 | $Yb_2O_3$ 12.5 | $TiO_2$ 0.5 | 0.5 | | 1900 × 6 | 50 |

| SAMPLE | POROSITY (%) | RATIO OF CRYSTAL PHASE TO GRAIN BOUNDARY PHASE (%) | THERMAL CONDUCTIVITY (W/m · K) | THREE-POINT BENDING STRENGTH (MPa) |
|---|---|---|---|---|
| 37 | 0.2 | 55 | 120 | 720 |
| 38 | 0.1 | 54 | 119 | 775 |
| 39 | 0.2 | 60 | 125 | 750 |
| 40 | 0.1 | 49 | 106 | 770 |
| 41 | 0.1 | 30 | 90 | 850 |
| 42 | 0.1 | 22 | 82 | 900 |
| 43 | 0.1 | 39 | 100 | 880 |
| 44 | 0.1 | 24 | 88 | 870 |
| 45 | 0.1 | 37 | 100 | 885 |
| 46 | 0.1 | 40 | 94 | 850 |
| 47 | 0.1 | 38 | 93 | 825 |
| 48 | 0.1 | 36 | 95 | 800 |
| 49 | 0.1 | 28 | 88 | 820 |
| 50 | 0.1 | 27 | 88 | 810 |
| 51 | 0.1 | 27 | 90 | 700 |

As is apparent from Tables 3 to 5, in the silicon nitride sintered bodies according to Samples 1 to 51, source compositions were properly controlled, and the cooling rates of the sintered bodies immediately after sintering for high density was completed were set to be lower than that of a conventional sintered body. For this reason, a high-strength silicon nitride substrate having a grain boundary phase including a crystal phase and high heat radiation characteristics and a high thermal conductivity which was in proportion to the ratio of the crystal phase to the grain boundary phase was obtained.

In contrast, in a case where a silicon nitride source powder containing 1.3 to 1.5 wt % of oxygen, a total amount of 0.13 to 0.16 wt % of the impurity cation element, and 93 wt % of α-phase type silicon nitride and having an average grain size of 0.60 μm was used and source powder obtained by adding 3 to 6 wt % of $Y_2O_3$ (yttrium oxide) powder and 1.3 to 1.6 wt % of an alumina powder to the silicon oxide powder was molded, degreased, sintered at 1,900° C. for 6 hours, and then cooled in the furnace (cooling rate: 400° C./hour), thereby obtaining a sintered body. In this case, the thermal conductivity of the sintered body was low, i.e., 25 to 28 w/m·K, and was approximated to the thermal conductivity value of a silicon nitride sintered body manufactured in a conventional general manufacturing method.

The silicon nitride sintered bodies according to Samples 1 to 51 obtained as described above were polished, thereby preparing silicon nitride substrates having thicknesses of 0.4 mm, 0.6 mm, and 0.8 mm as in Examples 11 to 13. Copper circuit plates or the like were integrally bonded to the surfaces of the prepared silicon nitride substrates by using the active metal brazing method as in Examples 11 to 13, thereby preparing silicon nitride circuit boards according to Example 16 as shown in FIG. 6.

Further, copper circuit plates or the like were directly bonded to the surfaces of the silicon nitride substrates by using the DBC method as in Example 14, thereby preparing a silicon nitride circuit board according to Example 16 as shown in FIG. 9.

Furthermore, circuit layers were formed on the surfaces of the silicon nitride substrates by using the metalize method as in Example 15, thereby preparing a silicon nitride circuit board according to Example 16 as shown in FIG. 10.

The maximum deflections and anti-breaking strengths of the $Si_3N_4$ substrates according to Example 16 on which the circuit layers are formed by the active metal brazing method, DBC method, and metalize method as described above were equal or higher than those of the substrates of Examples 11 to 15. In a heat cycle resistance test, the following excellent heat cycle resistance exhibited. That is, even after 1,000 cycles were performed, no cracks were formed in the $Si_3N_4$ substrate, and no metal circuit plate was peeled.

A circuit board in which an oxide layer is formed on the surface of a high thermal conductivity silicon nitride substrate and/or the surface of a metal circuit plate will be described below with reference to Examples described below.

A silicon nitride substrate constituting each circuit board is described first. Thereafter, a circuit board using the silicon nitride substrate is described.

EXAMPLE 17 to 19

Five weight percents of a $Y_2O_3$ (yttrium oxide) powder having an average grain size of 0.7 μm serving as a sintering assistant and 1.0 wt % of an $Al_2O_3$ (alumina) powder having an average grain size of 0.5 μm serving as a sintering assistant were added to a silicon nitride source powder containing 1.3 wt % of oxygen and a total amount of 0.15 wt % of Li, Na, K, Fe, Ca, Mg, Sr, Ba, Mn, and B serving as impurity cation elements, and 97 wt % of α-phase type silicon nitride and having an average grain size of 0.55 μm. The resultant mixture was wetly mixed in ethyl alcohol for 24 hours, and dried to prepare a source powder mixture.

Then, a predetermined amount of an organic binder was added to the prepared source powder mixture, and uniformly mixed. The mixture was press-molded by a molding pressure of 1,000 kg/cm² to manufacture a large number of molded bodies. Each obtained molded body was degreased at 700° C. in an atmospheric gas for 2 hours. The degreased body was held at 1,900° C. and 9 atoms in a nitrogen gas atmosphere for 6 hours, and was sintered to be made dense. Thereafter, quantity of electricity to a heating apparatus arranged in a sintering furnace was controlled to cool sintered bodies such that cooling rates of the sintered bodies were adjusted to 100° C./hr (for Example 17), 50° C./hr (for Example 18), and 25° C./hr (for Example 19) until the temperature in the furnace decreased to 1,500° C. The obtained sintered bodies were polished to prepare silicon nitride substrates for Examples 17 to 19.

Comparative Example 6

A sintering process was performed under the same conditions as those of Example 17 except that, immediately after sintering for high density was completed, the heating apparatus was turned off to cool a sintered body at a cooling rate (about 500° C./hr) in a conventional furnace, thereby preparing a silicon nitride sintered body according to Comparative Example 6.

Comparative Example 7

A process was performed under the same conditions as those of Example 17 except that a silicon nitride source powder containing 1.5 wt % of oxygen, a total of 0.6 wt % of Li, Na, K, Fe, Ca, Mg, Sr, Ba, Mn, and B serving as impurity cation elements, and 93 wt % of α-phase type silicon nitride and having an average grain size of 0.60 μm were used, thereby preparing a silicon nitride substrate for Comparative Example 7.

Comparative Example 8

A process was performed under the same conditions as those of Example 17 except that a silicon nitride source powder containing 1.7 wt % of oxygen, a total of 0.7 wt % of Li, Na, K, Fe, Ca, Mg, Sr, Ba, Mn, and B serving as impurity cation elements, and 91 wt % of α-phase type silicon nitride and having an average grain size of 1.1 μm were used, thereby preparing a silicon nitride substrate for Comparative Example 8.

A porosity and a thermal conductivity at 25° C. were measured with respect to the silicon nitride substrates for Examples 17 to 19 and Comparative Examples 6 to 8 obtained as described above. A ratio of a crystal phase to a grain boundary phase was measured by an X-ray diffraction method with respect to each $Si_3N_4$ substrate, thereby obtaining the result shown in Table 6 described below.

TABLE 6

| $Si_3N_4$ SUBSTRATE SAMPLE No. | COOLING RATE TO 1500° C. AFTER SINTERING (° C./hr) | POROSITY (%) | RATIO OF CRYSTAL PHASE TO GRAIN BOUNDARY PHASE (%) | THERMAL CONDUCTIVITY (W/m · K) |
|---|---|---|---|---|
| FOR EXAMPLE 17 | 100 | 0.2 | 30 | 70 |
| FOR EXAMPLE 18 | 50 | 0.2 | 50 | 92 |
| FOR EXAMPLE 19 | 25 | 0.2 | 80 | 115 |
| FOR COMPARATIVE EXAMPLE 6 | 500 | 0.2 | 0 | 40 |
| FOR COMPARATIVE EXAMPLE 7 | 100 | 0.3 | 0 | 27 |
| FOR COMPARATIVE EXAMPLE 8 | 100 | 2.5 | 0 | 20 |

As is apparent from the result shown in Table 6, in the silicon nitride sintered bodies for Examples 17 to 19, the cooling rates of the sintered bodies immediately after sintering for high density was completed were set to be lower than that of the sintered body of Comparative Example 6. For this reason, a high-strength $Si_3N_4$ substrate having a grain boundary phase including a crystal phase and high heat radiation characteristics and a high thermal conductivity which was in proportion to the ratio of the crystal phase to the grain boundary phase was obtained.

In contrast, as in Conventional Example 6, when the cooling rate of the sintered body was set to be high to rapidly cool the sintered body, the grain boundary phase was entirely amorphous, and a thermal conductivity decreased. As in Comparative Example 7, when a silicon nitride powder containing a large amount (0.6 wt %) of impurity cation elements was used, even if the cooling rate of the sintered body was set to be equal to that in Example 17, the grain boundary phase was entirely amorphous, and a thermal conductivity decreased.

Further, when a coarse silicon nitride powder having an average grain size of 1.1 μm as in Comparative Example 8, sufficient density could not be obtained in sintering, and both strength and thermal conductivity decreased.

The $Si_3N_4$ substrates for Examples 17 to 19 prepared as described above were processed to have thicknesses of 0.635 mm and 0.4 mm, the $Si_3N_4$ substrates for Comparative Examples 6 to 8 were processed to have a thickness of 0.635 mm, and the $Si_3N_4$ substrates were heated at 1,300° C. in an oxidizing furnace for 12 hours to oxidize the entire surfaces of the substrates, thereby forming oxide layers each having a thickness of 2 μm.

A copper circuit plate having a thickness of 0.3 mm and consisting of tough pitch electrolytic copper was arranged to be in contact with the front surface side of each $Si_3N_4$ substrate on which the oxide layer was formed, and a copper circuit plate having a thickness of 0.25 mm and consisting of tough pitch electrolytic copper was arranged to be in contact with the rear surface side of the $Si_3N_4$ substrate as a backing material, thereby forming a stacked body. The stacked body was inserted into a heating furnace having a temperature of 1,075° C. and an atmosphere adjusted to a nitrogen gas atmosphere, and heated for 1 minute, thereby preparing $Si_3N_4$ circuit boards in which copper circuit plates were directly bonded to both the surfaces of each $Si_3N_4$ substrate.

Figure 11:
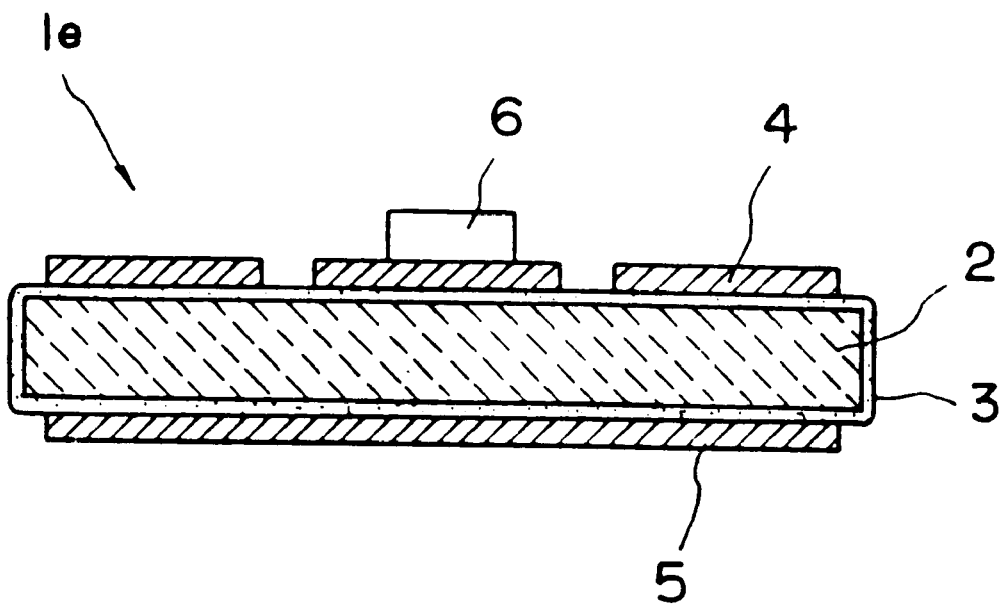
FIG. 11 is a sectional view showing an arrangement of the silicon nitride circuit board according to the present invention.

Each $Si_3N_4$ circuit board 1e has the following structure. That is, as shown in FIG. 11, an oxide layer 3 is formed on the entire surface of an $Si_3N_4$ substrate 2, and a copper circuit plate 4 serving as a metal circuit plate is directly bonded to the front surface side of the $Si_3N_4$ substrate 2, and a copper circuit plate 5 serving as a rear copper plate is directly bonded to the rear surface side as in the same manner as described above. A semiconductor element 6 is integrally bonded at a predetermined position of the copper circuit plate 4 on the front surface side through a soldering layer (not shown). When the copper circuit plates 4 and 5 are bonded to both the surfaces of the $Si_3N_4$ substrate 2, the copper circuit plate 5 serving as a rear copper plate effec-

Comparative Example 10

An oxide layer was formed in the same manner as that of Examples except that an aluminum nitride (AlN) substrate having a thermal conductivity of 70 W/m K and a thickness of 0.8 mm was used in place of the $Si_3N_4$ substrate used in Examples, and a copper circuit plate was integrally bonded to the AlN substrate by using the direct bonding method, thereby manufacturing an AlN circuit board according to Comparative Example 10.

In order to evaluate the strength characteristics, tenacity (toughness), and heat cycle resistance characteristics of each circuit board according to Examples and Comparative Examples prepared as described above, the three-point bending strength and the maximum deflection of each circuit board were measured. A heat cycle resistance test (TCT) was performed to examine the formation state of cracks in the circuit board.

The maximum deflection was measured as a maximum deflection height obtained such that a load is applied on the central portion of each circuit board with the circuit board supported at a support span of 50 mm, until $Si_3N_4$ substrate or the AlN substrate were broken.

An increase temperature-decrease temperature cycle having one cycle in which heating from −45° C. to room temperature (RT), heating from room temperature to +125° C., and cooling from +125° C. to −45° C. through room temperature were performed to the circuit boards was repeated, and the number of cycles performed until cracks or the like were formed in the substrate portions was measured, thereby performing a heat cycle resistance test.

The obtained measurement results are shown in Table 7 described below.

TABLE 7

| | CERAMIC SUBSTRATE | | | CIRCUIT BOARD CHARACTERISTICS | | |
|---|---|---|---|---|---|---|
| CIRCUIT BOARD SAMPLE No. | TYPE | THICKNESS (mm) | THERMAL CONDUCTIVITY (W/m · K) | THREE-POINT BENDING STRENGTH (MPa) | MAXIMUM DEFLECTION (mm) | HEAT RESISTANT CYCLES TEST (CYCLE NUMBER) |
| EXAMPLE 17 | $Si_3N_4$ | 0.635 | 70 | 650 | 1.0 | >1000 |
| | $Si_3N_4$ | 0.4 | 70 | 864 | 1.5 | >1000 |
| EXAMPLE 18 | $Si_3N_4$ | 0.635 | 92 | 672 | 1.1 | >1000 |
| | $Si_3N_4$ | 0.4 | 92 | 848 | 1.3 | >1000 |
| EXAMPLE 19 | $Si_3N_4$ | 0.635 | 115 | 676 | 1.0 | >1000 |
| | $Si_3N_4$ | 0.4 | 115 | 850 | 1.4 | >1000 |
| COMPARATIVE EXAMPLE 6 | $Si_3N_4$ | 0.635 | 40 | 660 | 1.0 | >1000 |
| COMPARATIVE EXAMPLE 7 | $Si_3N_4$ | 0.635 | 27 | 674 | 1.0 | >1000 |
| COMPARATIVE EXAMPLE 8 | $Si_3N_4$ | 0.635 | 20 | 641 | 1.0 | >1000 |
| COMPARATIVE EXAMPLE 9 | AlN | 0.635 | 170 | 274 | 0.5 | 100 |
| COMPARATIVE EXAMPLE 10 | AlN | 0.8 | 70 | 314 | 0.4 | 150 | tively contributes to acceleration of heat radiation and prevention of warpage.

Comparative Example 9

An oxide layer was formed in the same manner as that of Examples except that an aluminum nitride (AlN) substrate having a thermal conductivity of 170 W/m K and a thickness of 0.635 mm was used in place of the $Si_3N_4$ substrate used in Examples, and a copper circuit plate was integrally bonded to the AlN substrate by using the direct bonding method, thereby manufacturing an AlN circuit board according to Comparative Example 9.

As is apparent from the result shown in Table 7, according to the $Si_3N_4$ circuit board according to each Example, the bending strength and the maximum deflection are larger than those of the circuit board according to Comparative Example. Therefore, it was proved that clamping cracks were rarely formed in the assembly step of the circuit board, and that the production yield of a semiconductor device using the circuit substrate could be considerably improved.

In the heat cycle resistance test, in the $Si_3N_4$ circuit board of each Example, even after 1,000 cycles were performed, cracks in the $Si_3N_4$ substrate or peeling of the metal circuit plate (Cu circuit plate) rarely occurred. Therefore, it was proved that the $Si_3N_4$ substrate of each Example had excellent durability and reliability. In addition, even after 1,000 cycles were performed, withstand voltage characteristics were not degraded.

On the other hand, although the three-point bending strength, deflection, and heat cycle resistance characteristics were excellent in the $Si_3N_4$ substrates according to Comparative Examples 6 to 8, the heat conductivity of the $Si_3N_4$ substrate was relatively low, i.e., lower than 60 W/m K. For this reason, it was found that the $Si_3N_4$ substrate was not suitable for a semiconductor device having a tendency toward high output.

In the AlN circuit board according to Comparative Example 9, an AlN substrate having a high thermal conductivity was used. For this reason, it was confirmed that the AlN circuit board had excellent heat radiation characteristics but low strength and small deflection, and could not easily withstand to clamping cracks in the assembly step or shock in handling. In addition, the heat cycle resistance test, cracks were formed after 100 cycles were performed, and it was found that withstand voltage characteristics were degraded.

Since the AlN circuit board according to Comparative Example 10 had a thermalconductivity higher than that of a conventional $Si_3N_4$ substrate, the AlN circuit board had excellent heat radiation characteristics, but insufficient strength and deflection. In the heat cycle resistance test, cracks were formed after 150 cycles were performed, and it was found that withstand voltage characteristics degraded.

An embodiment of a circuit board using other silicon nitride substrates having various compositions and characteristics values will be described below with reference to Example 20 described below.

EXAMPLE 20

The silicon nitride sintered bodies according to Samples 1 to 51 prepared in Example 16 were polished, thereby preparing silicon nitride substrates having thicknesses of 0.4 mm and 0.635 mm as in Examples 17 to 19.

Each silicon nitride substrate was heated at 1,300° C. in an oxidizing furnace for 12 hours to oxide the entire surface of the substrate, thereby forming an oxide layer having a thickness of 2 $\mu$m.

On the other hand, the copper circuit plates prepared in Examples 17 to 19 and having thicknesses of 0.3 mm and 0.25 mm were heated at 250° C. for 30 seconds on a hot plate contacting the atmospheric air to oxidize the surfaces of the copper circuit plates, thereby integrally forming a copper oxide layer having a thickness of 1.5 $\mu$m on each copper circuit plate.

As is the same manner in Examples 17 to 19, by using the direct bonding method (DBC method), the copper circuit plate or the like was integrally bonded to the surface of each silicon nitride substrate on which the oxide layer was formed. In this manner, silicon nitride circuit boards 1f according to Example 20 shown in FIG. 12 were prepared.

Figure 12:
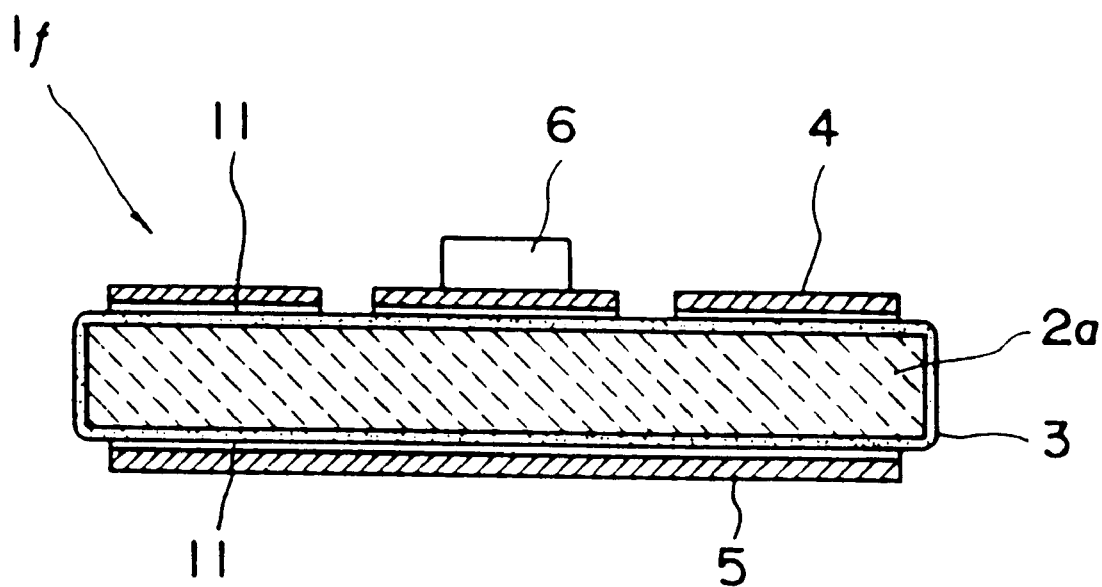
FIG. 12 is a sectional view showing another arrangement of the silicon nitride circuit board according to the present invention.

Each $Si_3N_4$ circuit board 1f has the following structure. That is, as shown in FIG. 12, an oxide layer 3 is formed on the entire surface of an $Si_3N_4$ substrate 2a, and copper oxide layers 11 are formed on the bonding surface sides of copper circuit plates 4 and 5. The copper circuit plate 4 serving as a metal circuit plate was directly bonded to the front surface side of the $Si_3N_4$ substrate 2a, and the copper circuit plate 5 serving as a rear copper plate is directly bonded to the rear surface side as in the same manner as described above. A semiconductor element 6 is integrally bonded at a predetermined position of the copper circuit plate 4 on the front surface side through a soldering layer (not shown).

The maximum deflection and anti-breaking strength of each $Si_3N_4$ circuit board according to Example 20 in which the circuit layer was formed by the DBC method as described above were equal or higher than those in Examples 17 to 19. In a heat cycle resistance test, the following excellent heat cycle resistance exhibited. That is, even after 1,000 cycles were performed, no cracks were formed in the $Si_3N_4$ substrate, and no circuit layer was peeled.

In particular, the oxide layer 3 was formed on the surface of the silicon nitride substrate 2a, and the copper oxide layers 11 were formed on the surfaces of the copper circuit plates 4 and 5. For this reason, an amount of Cu—O eutectic compound generated by bonding performed by the DBC method increased, and the bonding strength between the substrate 2a and the copper circuit plates 4 and 5 could be further improved. More specifically, the area ratios of the non-bonded portions of the copper circuit plates 4 and 5 in Example 20 were 5.2% and 5.6%, respectively, which were considerably smaller than those of Examples 17 to 19 (Example 17: 9.8% and 11.2%, Example 18: 13.8% and 11.5%, Example 19: 11.6% and 14.6%), and the bonding strength (peel strength) of the copper circuit plates increased by 20 to 30%.

A circuit board in which a plurality of semiconductor elements are mounted on a single high thermal conductive silicon nitride substrate will be described below with reference to Examples described below.

EXAMPLES 21 to 23

Five weight percents of a $Y_2O_3$ (yttrium oxide) powder having an average grain size of 0.7 $\mu$m serving as a sintering assistant and 1.0 wt % of an $Al_2O_3$ (alumina) powder having an average grain size of 0.5 $\mu$m serving as a sintering assistant were added to a silicon nitride source powder containing 1.3 wt % of oxygen and a total amount of 0.15 wt % of Li, Na, K, Fe, Ca, Mg, Sr, Ba, Mn, and B serving as impurity cation elements, and 97 wt % of $\alpha$-phase type silicon and having an average grain size of 0.55 $\mu$m. The resultant mixture was wetly mixed in ethyl alcohol for 24 hours, and dried to prepare a source powder mixture.

A predetermined amount of an organic binder was added to the prepared source powder mixture, and uniformly mixed. The mixture was press-molded by a molding pressure of 1,000 kg/cm² to manufacture a large number of molded bodies each having a length of 80 mm×a width of 50 mm×a thickness of 1 to 5 mm. Each obtained molded body was degreased at 700° C. in an atmospheric gas for 2 hours. The degreased body was held at 1,900° C. and 7.5 atoms in a nitrogen gas atmosphere for 6 hours, and was sintered to be made dense. Thereafter, quantity of electricity to a heating apparatus arranged in a sintering furnace was controlled to cool sintered bodies such that cooling rates of the sintered bodies were adjusted to 50° C./hr until the temperature in the furnace decreased to 1,500° C. The obtained sintered bodies were polished to prepare silicon nitride substrates for Examples 21 to 23 each having a thermal conductivity k of 92 W/m K, respectively having thicknesses of 0.4 mm, 0.6 mm, and 0.8 mm.

Figure 13:
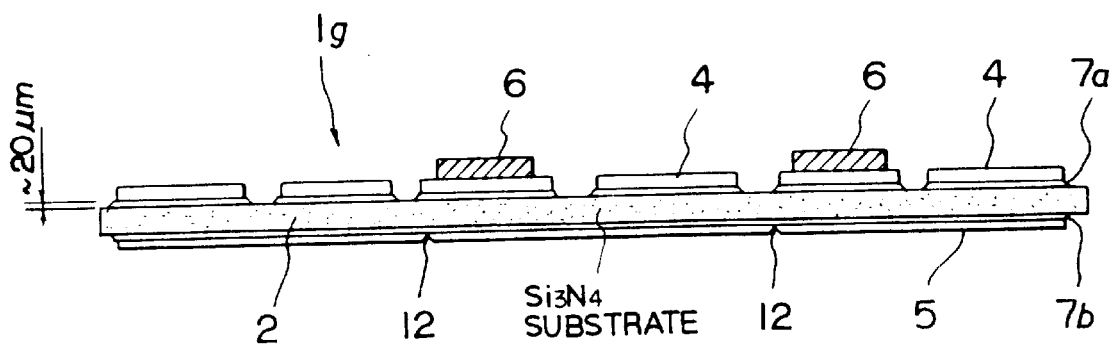
FIG. 13 is a sectional view showing a silicon nitride circuit board according to an embodiment of the present invention.

As shown in FIG. 13, a soldering material having a composition of 30 wt % Ag-65 wt % Cu-5 wt % Ti was screen-printed on a portion where a circuit layer was formed on the surface of each silicon nitride substrate 2 and a portion where a copper plate was bonded to the rear surface of the silicon nitride substrate 2 and dried to form active metal soldering material layers 7a and 7b each having a thickness of 20 $\mu$m.

A copper circuit plate 4 consisting of oxygen-free copper and having a thickness of 0.3 mm and a rear copper plate 5 having a thickness of 0.25 mm were arranged at predetermined positions of the active metal soldering material layers 7a and 7b to be in contact with the active metal soldering material layers 7a and 7b. The resultant structure was held at 850° C. in a vacuum state for 10 minutes to obtain a bonded body. Each bonded body was then etched to form a predetermined circuit pattern (circuit layer). A semiconductor element 6 was bonded to the central portion of the copper circuit plate 4 by soldering to manufacture a large number of silicon nitride circuit boards 1 g according to Examples 21 to 23.

Comparative Example 11

A copper circuit plate and a rear copper plate were integrally bonded to the surfaces of a substrate by an active metal brazing method in the same manner as that of Examples 21 to 23 except that an aluminum nitride (AlN) substrate having a thermal conductivity k of 70 W/m K and a thickness of 0.8 mm was used in place of the silicon nitride substrate used in Examples 21 to 23, thereby manufacturing a circuit board according to Comparative Example 11.

When the maximum deflections and anti-breaking strengths of the circuit board according to Examples 21 to 23 and Comparative Example 11 which were prepared as described above were measured, it was found that the silicon nitride circuit boards 1g according to Examples 21 to 23 had maximum deflections and anti-breaking strengths which were twice or more those of the circuit board of Comparative Example 11 using a conventional aluminum nitride substrate.

It was also confirmed that the deflection and anti-breaking strength were improved with a decrease in thickness of the silicon nitride substrate. Since the heat resistance decreased by reducing the thickness of the substrate, it was also confirmed that the heat radiation characteristics of the overall circuit board could be more improved.

When the circuit boards described above were mounted and clamped on boards in the assembly step, clamping cracks were not formed, and semiconductor devices using the circuit boards could be mass-produced at a high production yield.

Further, since the circuit board had the structure in which the plurality of semiconductor elements 6 were mounted on the single silicon nitride substrate 2 at once, the circuit board could be decreased in size in comparison with a case wherein a circuit board was formed for each semiconductor element. In addition, the number of times of mounting circuit boards on a device could be decreased, and packaging properties could be considerably improved.

An increase temperature-decrease temperature cycle having one cycle in which heating from −45° C. to room temperature (RT), heating from room temperature to +125° C., and cooling from +125° C. to −45° C. through room temperature were performed to the circuit boards was repeated, and the number of cycles performed until cracks or the like were formed in the substrate portions was measured, thereby performing a heat cycle resistance test. In this case, in the circuit boards of Examples 21 to 23, even after 1,000 cycles were performed, no cracks were formed in the $Si_3N_4$ substrates, and the metal circuit plates (Cu circuit plates) were not peeled.

Therefore, it was found that the circuit boards exhibited excellent heat cycle resistance characteristics. On the other hand, in the circuit board of Comparative Example, cracks were formed after 100 cycles were performed, and it was confirmed that the circuit board had poor durability.

In this regard, when grooves 12 each having V-shaped section are formed in the rear copper plate 5 at intervals as shown in FIG. 13, the expansion/contraction of the rear copper plate 5 in a heat cycle can be absorbed to some extent. For this reason, when a large circuit board 1 is formed by using a silicon nitride substrate 2 having a large area to mount a large number of elements 6 on the circuit board 1, heat stress is slightly generated by a heat cycle, and warpage rarely occurs in the circuit board 1g.

EXAMPLE 24

The $Si_3N_4$ substrates prepared in Examples 1 to 3, each having a thermal conductivity k of 92 W/m K, and respectively having a thickness of 0.4 mm, 0.6 mm, and 0.8 mm were heated at a temperature of 1,300° C. in an oxidizing furnace for 12 hours to oxidize the entire surfaces of the substrates, thereby forming oxide layers each having a thickness of 2 μm. The oxide layers were constituted by $SiO_2$ films.

A copper circuit plate having a thickness of 0.3 mm or 0.5 mm and consisting of tough pitch electrolytic copper was arranged to be in contact with the front surface side of each $Si_3N_4$ substrate on which the oxide layer was formed, and a copper circuit plate having a thickness of 0.25 mm and consisting of tough pitch electrolytic copper was arranged to be in contact with the rear surface side of the $Si_3N_4$ substrate as a backing material, thereby forming an assembled body. The assembled body was inserted into a heating furnace having a temperature of 1,075° C. and an atmosphere adjusted to a nitrogen gas atmosphere, and heated for 1 minute, thereby directly bonding the copper circuit plates to both the surfaces of each $Si_3N_4$ substrate. Two semiconductor elements were bonded to the copper circuit plate by soldering, thereby preparing $Si_3N_4$ circuit board.

Figure 14:
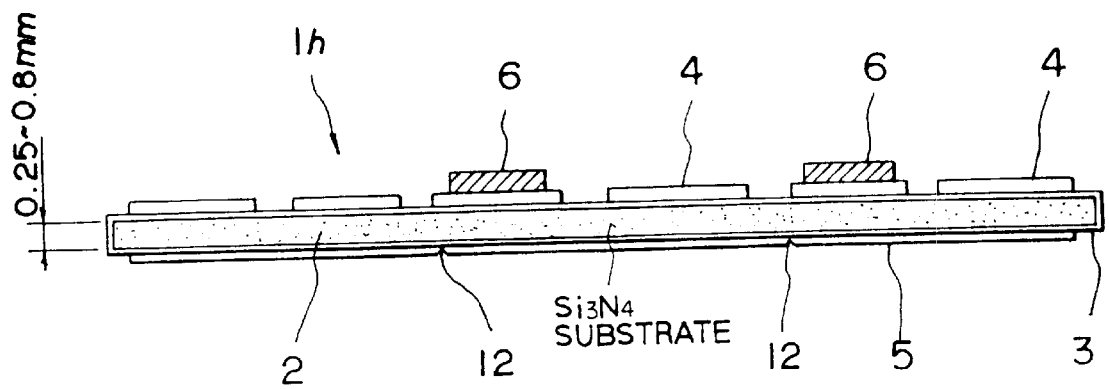
FIG. 14 is a sectional view showing a silicon nitride circuit board according to another embodiment of the present invention.

Each $Si_3N_4$ circuit board 1h has the following structure. That is, as shown in FIG. 14, an oxide layer 3 consisting of $SiO_2$ is formed on the entire surface of an $Si_3N_4$ substrate 2, a copper circuit plate 4 serving as a metal circuit plate was directly bonded to the front surface side of the $Si_3N_4$ substrate 2, and a copper circuit plate 5 serving as a rear copper plate is directly bonded to the rear surface side as in the same manner as described above. Semiconductor elements 6 are integrally bonded at two predetermined positions of the copper circuit plate 4 on the front surface side through a soldering layer (not shown). When the copper circuit plates 4 and 5 are bonded to both the surfaces of the $Si_3N_4$ substrate 2, the copper circuit plate 5 serving as a rear copper plate effectively contributes to acceleration of heat radiation and prevention of warpage of the circuit board.

The maximum deflection of the $Si_3N_4$ circuit board according to Example 24 in which a circuit layer was formed by the direct bonding method as described above fell within the range of 0.7 to 1.6 mm, and anti-braking strengths fell within the range of 550 to 900 MPa. As a result, the characteristic values almost equal to those obtained when a circuit layer was formed by the active metal method as in Examples 21 to 23 could be obtained.

In a heat cycle resistance test, the following excellent heat cycle resistance exhibited. That is, even after 1,000 cycles were performed, no cracks were formed in the $Si_3N_4$ substrate, and no metal circuit plate was peeled.

EXAMPLE 25

Figure 15:
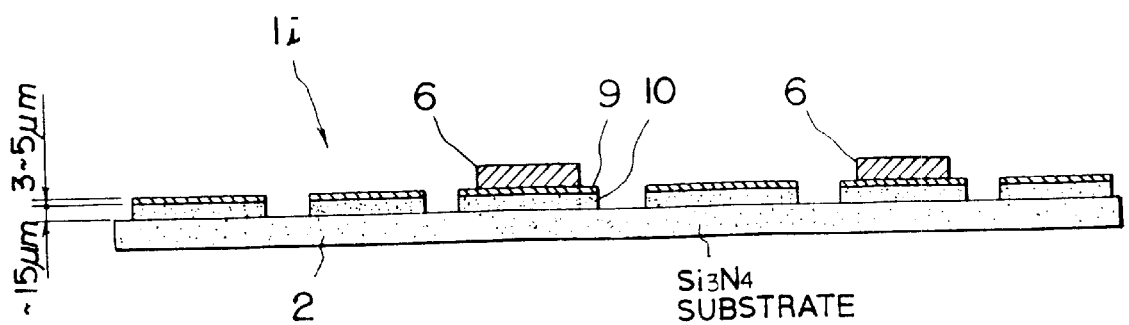
FIG. 15 is a sectional view showing a circuit board in which a circuit layer is formed by a metalize method.

As shown in FIG. 15, a paste obtained by adding a proper amount of binder and a solvent to a powder mixture of molybdenum (Mo) and titanium oxide ($TiO_2$) was screen-printed on the surfaces of the $Si_3N_4$ substrates 2 prepared in Examples 21 to 23, each having a thermal conductivity of 92 W/m K, and respectively having thicknesses of 0.4 mm, 0.6 mm, and 0.8 mm, and was heated and baked to form refractory metal metalized layers 10 each having a thickness of 15 μm.

Then, an Ni-plating layer 9 having a thickness of 3 μm was formed by electroless plating on each metalized layer 10 to form a circuit layer having a predetermined pattern. Subsequently, semiconductor elements 6 were bonded at two position of the circuit layer by soldering, thereby manufacturing a large number of silicon nitride circuit boards 1i according to Example 25.

The maximum deflection of the $Si_3N_4$ circuit board according to Example 25 in which a circuit layer was formed by the metalize method as described above fell within the range of 1.0 to 1.8 mm, and anti-braking strengths fell within the range of 650 to 950 MPa. As a result, the characteristic values almost equal to those obtained when a circuit layer was formed by the active metal brazing method as in Examples 21 to 23 could be obtained. In a heat cycle resistance test, the following excellent heat cycle resistance exhibited in the plated circuit board. That is, even after 1,000 cycles were performed, no cracks were formed in the $Si_3N_4$ substrate, and no circuit layer (metalized layer) 8 was peeled.

An embodiment of a circuit board using other silicon nitride substrates having various components and various characteristic values will be described below with reference to Example 26.

EXAMPLE 26

The silicon nitride sintered bodies according to Samples 1 to 51 prepared in Example 16 were polished, thereby preparing silicon nitride substrates having thicknesses of 0.4 mm, 0.6 mm, and 0.8 mm as in Examples 21 to 23. Copper circuit plates or the like were integrally bonded to the surfaces of the prepared silicon nitride substrates by using the active metal brazing method as in Examples 21 to 23, thereby preparing silicon nitride circuit boards according to Example 26 as shown in FIG. 13.

Copper circuit plates or the like were directly bonded to the surfaces of the silicon nitride substrates by using the DBC method as the same manner as in Example 24, thereby preparing a silicon nitride circuit board according to Example 26 as shown in FIG. 14.

Circuit layers were formed on the surfaces of the silicon nitride substrates by using the metalize method as in Example 25, thereby preparing a silicon nitride circuit board according to Example 26 as shown in FIG. 15.

The maximum deflections and anti-breaking strengths of the $Si_3N_4$ circuit boards according to Example 26 on which the circuit layers are formed by the active metal brazing method, DBC method, and metalize method as described above were equal or higher than those of the circuit boards of Examples 21 to 25. In a heat cycle resistance test, the following excellent heat cycle resistance exhibited. That is, even after 1,000 cycles were performed, no cracks were formed in the $Si_3N_4$ substrate, and no circuit layer was peeled.

According to the silicon nitride circuit board according to Examples described above, a circuit layer is integrally bonded to the surface of a high thermal conductive silicon nitride substrate having high-strength and high-tenacity characteristics, which are original characteristics of a silicon nitride sintered body, and improved thermal conductivity, and a plurality of semiconductor elements are mounted on the circuit board. Therefore, even if a large circuit board is formed to mount a plurality of semiconductor elements, since the tenacity value of the circuit board is high, the maximum deflection can be assured to be large. For this reason, clamping cracks in the circuit board are not formed in the assembly step, and a semiconductor device using the circuit board can be mass-produced at a high production yield.

In addition, since a plurality of semiconductor elements are mounted on the surface of a single silicon nitride substrate to constitute a circuit board, in comparison with a conventional case wherein a circuit board is formed for each semiconductor element, the total number of circuit boards can be reduced. Therefore, the assembling and packaging step of the circuit boards can be simplified, and the manufacturing efficiency of a semiconductor device can be improved.

A composite silicon nitride circuit board in which a silicon nitride substrate and an aluminum nitride substrate are arranged on the same plane will be described below.

Embodiments 27 to 29

Five weight percents of a $Y_2O_3$ (yttrium oxide) powder having an average grain size of 0.7 μm serving as a sintering assistant and 1.0 wt % of an $Al_2O_3$ (alumina) powder having an average grain size of 0.5 μm serving as a sintering assistant were added to a silicon nitride source powder containing 1.3 wt % of oxygen and a total amount of 0.15 wt % of Li, Na, K, Fe, Ca, Mg, Sr, Ba, Mn, and B serving as impurity cation elements, and 97 wt % of α-phase type silicon nitride and having an average grain size of 0.55 μm.

The resultant mixture was wetly mixed in ethyl alcohol for 24 hours, and dried to prepare a source powder mixture. A predetermined amount of an organic binder was added to the prepared source powder mixture, and uniformly mixed. The mixture was press-molded by a molding pressure of 1,000 kg/cm² to manufacture a large number of molded bodies each having a length of 80 mm×a width of 50 mm×a thickness of 1 to 5 mm.

Each obtained molded body was degreased at 700° C. in an atmospheric gas for 2 hours. The degreased body was then held at 1,900° C. and 7.5 atoms in a nitrogen gas atmosphere for 6 hours, and was sintered to be made dense. Thereafter, quantity of electricity to a heating apparatus arranged in a sintering furnace was controlled to moderately cool the sintered bodies such that cooling rates of the sintered bodies were adjusted to 100° C./hr until the temperature in the furnace decreased to 1,500° C. The obtained sintered bodies were polished to prepare silicon nitride substrates for Examples 27 to 29 each having a thermal conductivity k of 70 W/m K, respectively having thicknesses of 0.4 mm, 0.6 mm, and 0.8 mm.

On the other hand, 0.01 wt % of Si calculated from $SiO_2$ serving as an Si component and 5 wt % of $Y_2O_3$ serving as a sintering assistant were added to an aluminum nitride containing 0.8 wt % of oxygen as an impurity and having an average grain size of 1 μm. The resultant mixture was mixed by a ball mill using ethyl alcohol as a solvent for 20 hours to prepare a source mixture. Then, 5.5 wt % of polyvinyl alcohol (PVA) serving as an organic binder were added to the source mixture to prepare granulated powder.

The obtained granulated powder was filled in a molding die of a press molder to be compressed and molded in one-axial direction by a pressure of 1,200 kg/cm², thereby preparing a large number of square-plate-like molded bodies. Then, the molded bodies were heated at 450° C. in the air for 1 hour to be degreased.

Each degreased molded body was stored in a sintering vessel consisting of AlN, and the molded body was sintered at a sintering temperature of 1,760 to 1,780° C. in a sintering furnace for 4 hours to be dense. Thereafter, the sintered body was cooled at a cooling rate of 200° C./hr, thereby manufacturing AlN substrates for Examples 27 to 29 each having a thermal conductivity of 182 W/m K and a thickness equal to that of the $Si_3N_4$ substrate.

Figure 17:
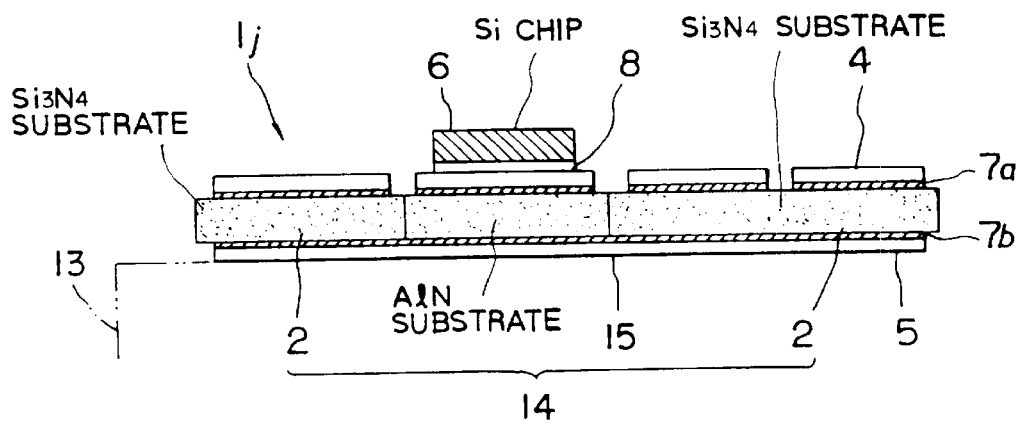
FIG. 17 is a sectional view showing a silicon nitride circuit board according to an embodiment of the present invention, and is a sectional view showing the silicon nitride circuit board along a line XVII—XVII in FIG. 16.

As shown in FIG. 17, an $Si_3N_4$ substrate 2 and an AlN substrate 15 having the same thickness were combined to each other on the same plane to form a composite substrate 14. More specifically, the AlN substrate 15 was arranged at a portion on which a semiconductor element 6 was mounted, while the $Si_3N_4$ substrate 2 was arranged at the remaining portion, thereby forming the composite substrate 14.

Figure 16:
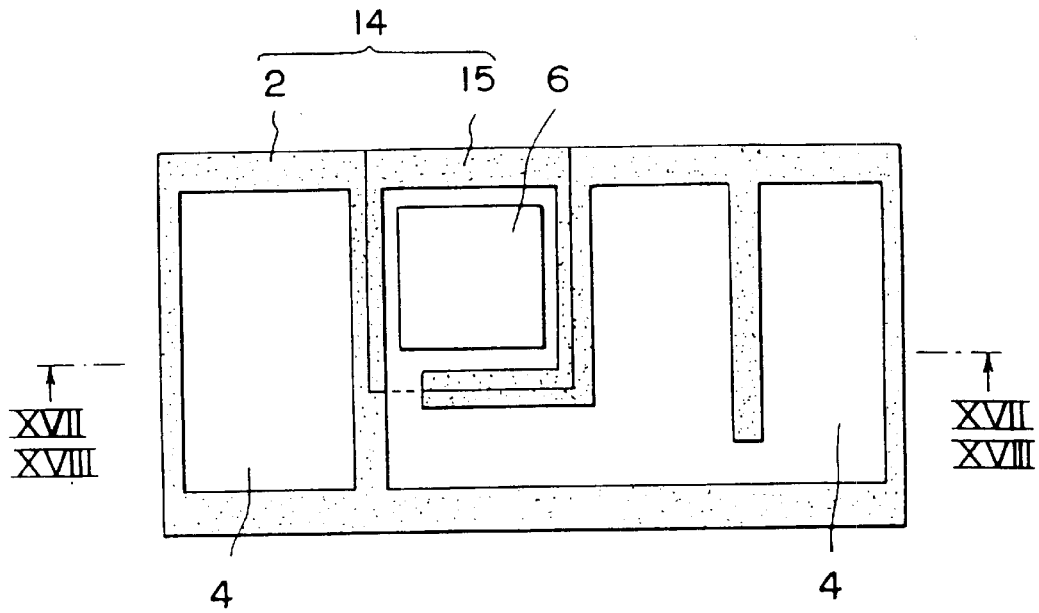
FIG. 16 is a plan view showing an arrangement of a silicon nitride circuit board according to the present invention.

As shown in FIGS. 16 and 17, a soldering material having a composition of 30 wt % Ag-65 wt % Cu-5 wt % Ti was screen-printed on a portion where a circuit layer was formed on the surface of each silicon nitride substrate 2 and the aluminum nitride substrate 15 and a portion where a copper plate was bonded to the rear surface of the silicon nitride substrate 2 and the aluminum nitride 15 and dried to form active metal soldering material layers 7a and 7b each having a thickness of 20 µm.

Then, a copper circuit plate 4 consisting of tough pitch electrolytic copper and having a thickness of 0.3 mm and a metal plate (rear copper plate) 5 having a thickness of 0.25 mm were arranged at predetermined positions of the active metal soldering material layers 7a and 7b to be in contact with the active metal soldering material layers 7a and 7b. The resultant structure was held at 850° C. in a vacuum state for 10 minutes to obtain a bonded body.

Each bonded body was then etched to form a predetermined circuit pattern (circuit layer). Then, a semiconductor element 6 was bonded to the central portion of the copper circuit plate 4 through a soldering layer 8 to manufacture a large number of composite silicon nitride circuit boards 1f according to Examples 27 to 29.

Comparative Example 12

A copper circuit plate and a rear copper plate were integrally bonded to the surfaces of a substrate by an active metal brazing method in the same manner as that of Examples 27 to 29 except that a ceramic substrate consisting of only an aluminum nitride (AlN) sintered body having a thermal conductivity k of 182 W/m K and a thickness of 0.8 mm was used in place of the composite substrate 14 used in Examples 27 to 29 and consisting of the $Si_3N_4$ substrate 2 and the AlN substrate 15, thereby manufacturing a silicon nitride circuit board according to Comparative Example 12.

When the maximum deflections and anti-breaking strengths of the circuit board according to Examples 27 to 29 and Comparative Example 12 which were prepared as described above were measured, it was found that the composite silicon nitride circuit boards 1j according to Examples 27 to 29 had maximum deflections and anti-breaking strengths which were twice or more those of the circuit board of Comparative Example 12 using only a conventional aluminum nitride substrate.

It was also confirmed that the deflection and anti-breaking strength were improved with a decrease in thickness of the composite silicon nitride substrate. Since the heat resistance decreased by reducing the thickness of the substrate, it was also confirmed that the heat radiation characteristics of the overall circuit board could be more improved.

When the composite circuit boards of Examples described above were mounted on boards in the assembly step after the composite silicon nitride circuit boards were bonded to a heat sink as shown in FIG. 17, clamping cracks were not formed, and semiconductor devices using the circuit boards could be mass-produced at a high production yield.

An increase temperature-decrease temperature cycle having one cycle in which heating from −45° C. to room temperature (RT), heating from room temperature to +125° C., and cooling from +125° C. to −45° C. through room temperature were performed to the circuit boards was repeated, and the number of cycles performed until cracks or the like were formed in the substrate portions was measured, thereby performing a heat cycle resistance test.

In this case, in the composite circuit boards of Examples 27 to 29, even after 1,000 cycles were performed, no cracks were formed in the $Si_3N_4$ substrates or the AlN substrates, and the metal plates were not peeled at all. Therefore, it was found that the circuit boards exhibited excellent heat cycle resistance characteristics. On the other hand, in the circuit board of Comparative Example 12, cracks were formed after 100 cycles were performed, and it was confirmed that the circuit board had poor durability.

EXAMPLE 30

The $Si_3N_4$ substrates prepared in Examples 27 to 29, each having a thermal conductivity k of 70 W/m K, and respectively having a thickness of 0.4 mm, 0.6 mm, and 0.8 mm were heated at a temperature of 1,300° C. in an oxidizing furnace for 12 hours to oxidize the entire surfaces of the substrates, thereby forming oxide layers each having a thickness of 2 µm. The oxide layers were constituted by $SiO_2$ films.

The AlN substrates prepared in Examples 27 to 29, each having a thermal conductivity k of 182 W/m K, and respectively having a thickness of 0.4 mm, 0.6 mm, and 0.8 mm were heated at a temperature of 1,200° C. in the air for 0.5 hours to oxidize the entire surfaces of the substrates, thereby forming oxide layers each having a thickness of 2 µm. The oxide layers were constituted by $Al_2O_3$ films.

Figure 18:
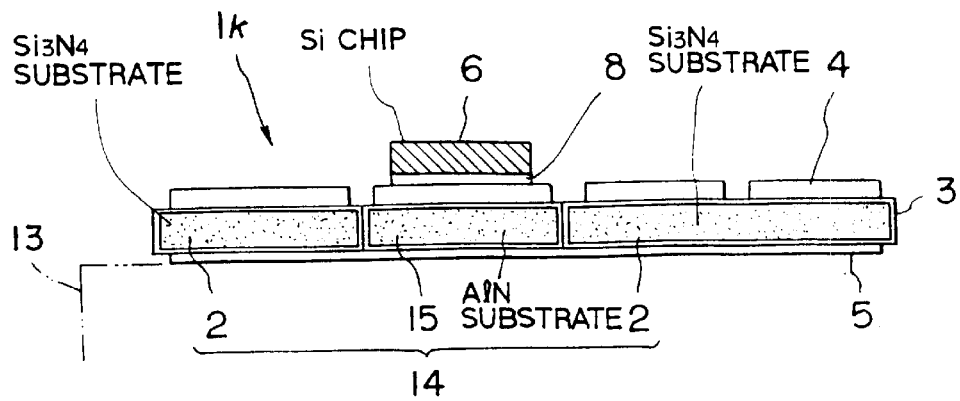
FIG. 18 is a sectional view showing a silicon nitride circuit board according to another embodiment of the present invention, and is a sectional view showing the silicon nitride circuit board along a line XVIII—XVIII in FIG. 16.

As shown in FIG. 18, an $Si_3N_4$ substrate 2 and an AlN substrate 15 having the same thickness were combined to each other on the same plane to form a composite substrate 14. More specifically, the AlN substrate 15 was arranged at a portion on which a semiconductor element 6 was mounted, and the $Si_3N_4$ substrate 2 was arranged at the remaining portion, thereby forming the composite substrate 14.

A copper circuit plate having a thickness of 0.3 mm and consisting of tough pitch electrolytic copper was arranged to be in contact with the front surface side of each composite substrate 14 constituted by the $Si_3N_4$ substrate 2 and AlN substrate 15 on which the oxide layer was formed, and a copper circuit plate having a thickness of 0.25 mm and consisting of tough pitch electrolytic copper was arranged to be in contact with the rear surface side of the composite substrate 14 as a backing material, thereby forming an assembled body.

The assembled body was inserted into a heating furnace having a temperature of 1,075° C. and an atmosphere adjusted to a nitrogen gas atmosphere, and heated for 1 minute, thereby directly bonding the copper circuit plates or metal plates to both the surfaces of each composite substrate 14. Then, a semiconductor element was bonded to the copper circuit plate by soldering, thereby preparing a composite silicon nitride circuit board 1k according to Example 30.

Each composite silicon nitride circuit board 1k has the following structure. That is, as shown in FIG. 18, an oxide layer 3 consisting of $SiO_2$ or $Al_2O_3$ is formed on the entire surface of the $Si_3N_4$ substrate 2 and the AlN substrate 15, a copper circuit plate 4 serving as a metal circuit plate was directly bonded to the front surface side of composite substrate 14 constituted by the $Si_3N_4$ substrate 2 and the AlN substrate 15, and a copper circuit plate 5 serving as a rear copper plate is directly bonded to the rear surface side as in the same manner as described above. A semiconductor element 6 is integrally bonded at a predetermined position of the copper circuit plate 4 on the front surface side through a soldering layer 8.

When the copper circuit plate 4 or 5 is bonded to both the surfaces of the composite substrate 14, the copper circuit plate 5 serving as a rear copper plate effectively contributes to acceleration of heat radiation and prevention of warpage of the circuit board.

The maximum deflection of the composite silicon nitride circuit board according to Example 30 in which a circuit layer was formed by the direct bonding method as described above fell within the range of 0.8 to 1.6 mm, and anti-braking strengths fell within the range of 550 to 900 MPa. As a result, the characteristic values almost equal to those obtained when a circuit layer was formed by the active metal brazing method as in Examples 27 to 29 could be obtained. In a heat cycle resistance test, the following excellent heat cycle resistance exhibited. That is, even after 1,000 cycles were performed, no cracks were formed in the $Si_3N_4$ substrate and the AlN substrate, and no metal circuit plate was peeled.

An embodiment of a composite ceramic substrate formed by stacking or laminating a silicon nitride substrate and aluminum nitride substrate will be described below.

Figure 19:
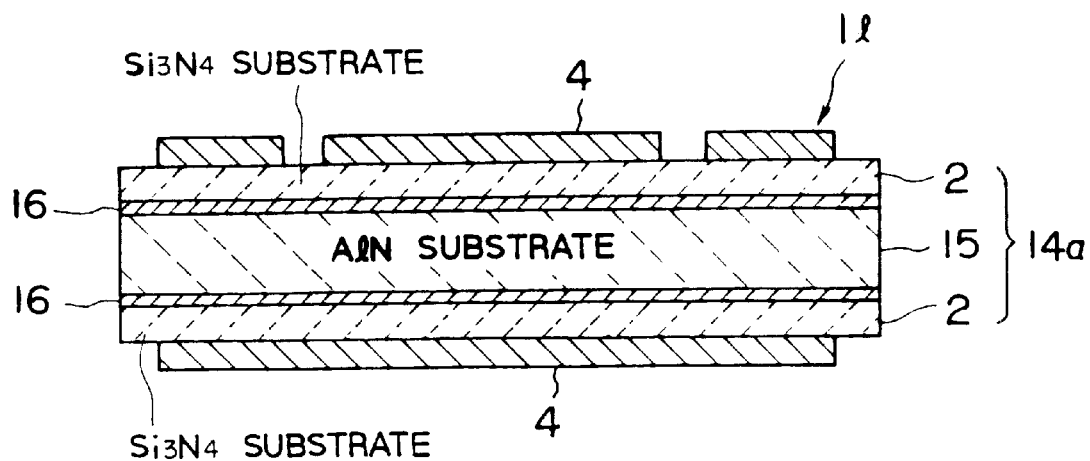
FIG. 19 is a sectional view showing a silicon nitride circuit board according to still another embodiment of the present invention.

FIG. 19 is a sectional view showing an embodiment of a composite silicon nitride circuit board according to the present invention. Referring to FIG. 19, reference numeral 2 denotes silicon nitride substrates. The two silicon nitride substrates 2 are stacked through an aluminum nitride substrate 15 to be integrated with each other.

More specifically, the aluminum nitride substrate 15 is interposed between the two silicon nitride substrates 2 arranged on the surface sides, and a composite substrate 14a is constituted by a three-layer sandwich structure constituted by the silicon nitride substrate 2, the aluminum nitride substrate 15, and the silicon nitride substrate 2.

As the silicon nitride substrate 2 and the aluminum nitride substrate 15 described above, general ones which are conventionally used can be used. In particular, as the silicon nitride substrate 2, a silicon nitride substrate having a thermal conductivity of 60 W/m K or more is preferably used.

The silicon nitride sintered body constituting the silicon nitride substrate 2 is well known as a high-strength and high-tenacity ceramic sintered body. When the silicon nitride sintered body is highly purified, or its composition is strictly adjusted, a silicon nitride sintered body having excellent thermal conductivity, i.e., a thermal conductivity of 60 W/m K or more, can be obtained without degrading the original mechanical characteristics such as high strength and high tenacity.

In this embodiment, the silicon nitride substrate 2 having relatively excellent thermal conductivity as described above is preferably used. As the aluminum nitride substrate 15, a general-used aluminum nitride substrate having a high thermal conductivity of 170 W/m K or more is preferably used.

The silicon nitride substrates 2 and the aluminum nitride substrate 15 constituting the composite substrate 14a are bonded to each other through active metal bonding layers 16. As an active metal bonding method, an active metal soldering method using an active metal soldering material containing an active metal such as a 4A-group element or a 5A-group element or an active metal solid-phase bonding method using a foil or powder of an active metal can be applied.

For example, as the active metal soldering material, a soldering material obtained by adding at least one active metal selected from Ti, Zr, Hf, and Nb to a soldering material having an Ag—Cu eutectic composition (72 wt % Ag-28 wt % Cu) or a composition similar to the Ag—Cu eutectic composition, a soldering material obtained by adding such an active metal to Cu, or the like is used. A low-melting-point active metal soldering material whose melting point is decreased by adding In or Sn to the above active metal soldering material can also be used.

Not only the active metal bonding method described above, but also, as shown in FIG. 20, a glass bonding method can be applied to bonding between the silicon nitride substrates 2 and the aluminum nitride substrate 15. In this case, as glass layers 17 serving as bonding layers consist of bonding glass such as borosilicate glass.

When the active metal bonding method is applied to bonding between the silicon nitride substrates 2 and the aluminum nitride substrate 15, a copper plate (circuit) can be advantageously formed by the active metal brazing method at once. On the other hand, when the glass bonding method is applied, a copper plate (circuit) can be advantageously bonded by the direct bonding copper (DBC) method.

Although the thicknesses of the silicon nitride substrate 2 and the aluminum nitride substrate 15 constituting the composite substrate 14a depend on required characteristics or the total thickness of the composite substrate 14a, the thickness of the silicon nitride substrate 2, located on the surface side, for improving mechanical strength is preferably set to be 0.2 mm or more.

When the thickness of the silicon nitride substrate 2 is smaller than 0.2 mm, the composite substrate 14a may not obtain sufficient mechanical strength. However, when the thickness of the silicon nitride substrate 2 is too large, the heat radiation characteristics of the composite substrate 14a may be degraded. For this reason, the thickness of the silicon nitride substrate 2 is preferably set to be smaller than 0.5 mm.

Since the aluminum nitride substrate 15 functions to improve the heat radiation characteristics of the composite substrate 14a, the thickness of the aluminum nitride substrate 15 is preferably set such that the thickness of the aluminum nitride substrate 15 occupies 20% or more (more preferably, 30% or more) of the total thickness of the composite substrate 14a. When the thickness of the aluminum nitride substrate 15 is smaller than 20%, the heat radiation characteristics of the composite substrate 14a may be degraded.

In this manner, the aluminum nitride substrate 15 has a thickness larger than that of the silicon nitride substrate 2. However, since the characteristics such as mechanical strength and heat radiation characteristics of the composite substrate 14a change depending on the respective material characteristics of the silicon nitride substrate 2 and the aluminum nitride substrate 15, these thicknesses are preferably set in consideration of the characteristics thereof.

In the composite substrate 14a according to this embodiment, the surface portion on which mechanical pressure, mechanical stress, heat stress, and the like directly act is constituted by the high-strength and high-tenacity silicon nitride substrate 2. For this reason, clamping cracks in the assembly step, cracks caused by a heat cycle, or the like can be suppressed. More specifically, since heat stress, mechanical stress, or the like basically acts on only the surface, when the surface portion is constituted by the high-strength and high-tenacity silicon nitride substrate 2, occurrence of breaking or cracking can be suppressed.

On the other hand, since the thermal conductivity of the composite substrate 14a is obtained by the aluminum nitride substrate 15 located between the silicon nitride substrates 2, sufficiently high thermal conductivity can be obtained as the thermal conductivity of the composite substrate 14a. In this manner, the composite substrate 14a has both the characteristic features of the high-strength high-tenacity silicon nitride substrate 2 and the aluminum nitride substrate 15 having excellent thermal conductivity.

Copper plates 4 are bonded to the major surfaces of the composite substrate 14a, i.e., the silicon nitride substrates 2, to constitute a circuit (wiring layer) or a semiconductor element mount portion, thereby constituting a composite ceramic substrate 1b. The copper plates 4 can be bonded to the silicon nitride substrates 2 by the active metal bonding method or a copper direct bonding method (so-called DBC method). The metal layer serving as a circuit or the like can be constituted by not only the copper circuit plate 4 described above but also coating a thick-film paste, baking, or the like. As the thick-film paste, a paste containing a refractory metal such as W or Mo, an Ag—Cu-alloy paste containing an active metal, or the like is used.

Another embodiment of the present invention will be described below with reference to FIG. 21.

Figure 21:
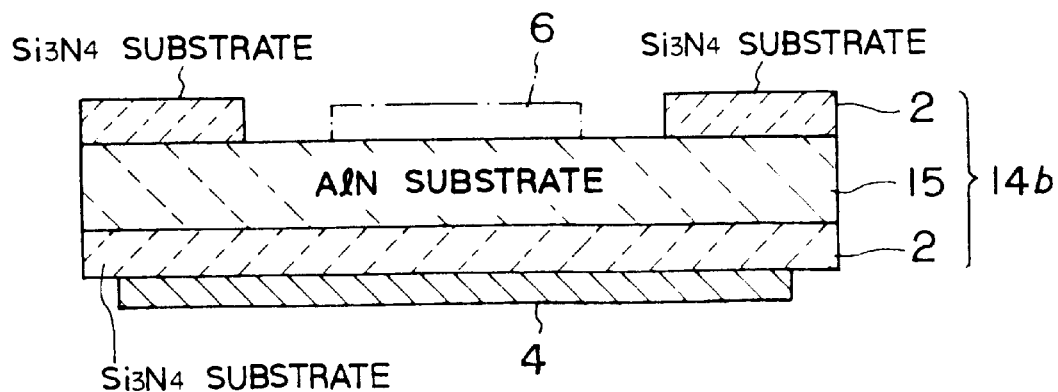
FIG. 21 is a sectional view showing a silicon nitride circuit board according to still another embodiment of the present invention.

FIG. 21 shows an arrangement in which the composite silicon nitride circuit board according to the present invention is used as a heat sink. In this arrangement, the silicon nitride substrate 2 on the upper surface side is bonded to only the peripheral portion to which mechanical pressure or the like directly acts, i.e., only the peripheral portion of the upper surface of the aluminum nitride substrate 15.

The silicon nitride substrate 2 on the lower surface side is bonded to the entire surface of the aluminum nitride substrate 15, thereby constituting the composite substrate 14b. Although not shown, the silicon nitride substrates 2 and the aluminum nitride substrate 15 are bonded to each other by the active metal bonding method, the glass bonding method, or the like as in the embodiment described above. A copper circuit plate 4 is bonded to the surface of the silicon nitride substrate 2 on the lower surface in the same manner as described above.

As described above, in the composite silicon nitride circuit board according to this embodiment, since the silicon nitride substrate 2 on the upper surface side is bonded to only the peripheral portion on which mechanical pressure or the like directly acts, an electronic part such as a semiconductor element 6 can be directly mounted on the aluminum nitride substrate 15 having excellent thermal conductivity. Therefore, heat from the semiconductor element 6 can be rapidly radiated. In this manner, according to an electronic part mounting ceramic substrate of the present invention, while the characteristics of a heat sink are kept, clamping cracks in the assembly step and cracks caused by a heat cycle can be suppressed.

The composite substrate 14b having the structure shown in FIG. 21 can be used as a package base of, e.g., a QFP. More specifically, when a lead frame is bonded to the silicon nitride substrate 2 bonded to the upper surface of the aluminum nitride substrate 15, cracks or the like formed by stress caused by bonding of the lead frame can be prevented. Since the semiconductor element 6 can be directly mounted on the aluminum nitride substrate 15 like as in a case wherein the heat sink is arranged, preferable heat radiation characteristics can be obtained as the heat radiation characteristics of a QFP.

As shown in FIG. 21, in the composite ceramics substrate of the present invention, the silicon nitride substrate 2 is not necessarily bonded to the entire surface of the aluminum nitride substrate 15, the silicon nitride substrate 2 can be partially bonded to the aluminum nitride substrate 15.

The composite ceramic substrate of the present invention can be used as not only a ceramic substrate, a heat sink, or the like, but also the base of a package for a semiconductor device as described above. For example, when the composite substrate of the present invention is used as a package base of a BGA, a PGA, or the like, heat stress especially acts on the bonded portion between the composite substrate and the printed wiring substrate. For this reason, the silicon nitride substrate can be used to be bonded to the side on which the heat stress concentrically acts. More specifically, in the present invention, a composite substrate in which a silicon nitride substrate is integrally bonded to one surface of an aluminum nitride substrate.

In this manner, in the electronic part mounting ceramic substrate of the present invention, the bonding position of the silicon nitride substrate to the aluminum nitride substrate is not limited to a specific position. The silicon nitride substrate can be bonded to various positions which require mechanical strength, and composite substrates having various arrangements can be used.

An embodiment of a stack type composite ceramic substrate will be described below with reference to Example 31.

EXAMPLE 31

The surfaces of the silicon nitride sintered bodies according to Samples 1 to 51 prepared in Example 16 were polished, thereby preparing two silicon nitride substrates each having a thickness of 0.2 mm from each sample sintered body. On the other hand, a large number of aluminum nitride each having the same planar shape as that of the silicon nitride substrate, a thermal conductivity of 170 W/m K, and a thickness of 0.4 mm were prepared.

Then, the silicon nitride substrates 2 are bonded to both the surfaces of the aluminum nitride substrate 15 by the active metal brazing method, thereby preparing composite substrates 14a each a thickness of 0.8 mm and the sandwich structure shown in FIG. 19. Copper plates 4 were bonded to both the major surfaces of each composite substrate 14a by the active metal brazing method. Thereafter, the resultant structure was etched to form a predetermined wiring pattern, thereby manufacturing composite silicon nitride circuit boards according to Example 31.

When the bending strength of each composite silicon nitride circuit board 1l obtained as described above was measured, the composite silicon nitride circuit board 1l had a preferable value, i.e., an average value of 500 MPa. When a heat cycle test (233K-RT-398K) was performed to each composite silicon nitride circuit board, even after 1,000 cycles were performed, no cracks were detected, and a withstand voltage did not decrease.

EXAMPLE 32

Figure 20:
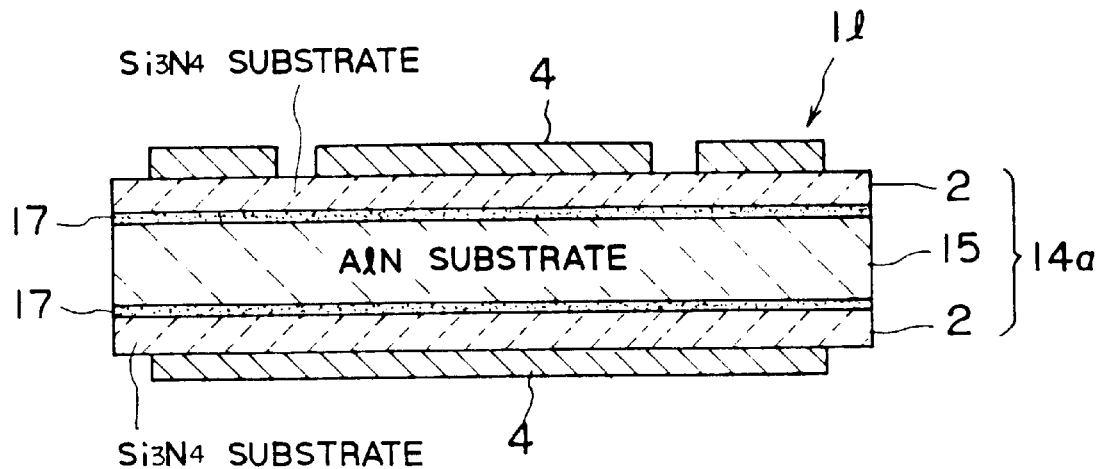
FIG. 20 is a sectional view showing a modification of the silicon nitride circuit board shown in FIG. 19.

The aluminum nitride substrate 15 prepared in Example 31 and having a thermal conductivity of 170 W/m K and a thickness of 0.4 mm and silicon nitride substrates 2 having a thickness of 0.2 mm and cut from the silicon nitride sintered bodies according to Samples 1 to 51 on the same plane as that of the aluminum nitride substrate 15 were bonded to each other by using a borosilicate glass, thereby obtaining a composite substrate 14a having a thickness of 0.8 mm and having a sandwich structure shown in FIG. 20. Then, copper plates 4 were bonded to both the major surfaces of the composite substrate 14a by a direct bonding copper method (DBC method). The resultant structure was etched to form a pattern, thereby manufacturing composite silicon nitride circuit boards 1l according to Example 32.

When the bending strength of each composite silicon nitride circuit board 1l obtained as described above was measured, the composite silicon nitride circuit board 1l had a preferable value, i.e., an average value of 500 MPa. When a heat cycle test (233K-RT-398K) was performed to each composite silicon nitride circuit board 1l, even after 1,000 cycles were performed, no cracks were detected, and a withstand voltage did not decrease.

Comparative Example 13

Copper plates were bonded to both the major surfaces of an aluminum nitride substrate having a thermal conductivity of 170 W/m K and a thickness of 0.8 mm by a direct bonding method (DBC method). The resultant structure was etched to form a pattern. When the bending strength of each aluminum nitride circuit board obtained as described above was measured, a bending strength of 300 MPa was obtained. When a heat cycle test (233K-RT-398K) was performed to the ceramic circuit board, cracks were formed after 300 cycles were performed, and a withstand voltage decreased.

Comparative Example 14

Copper plates were bonded to both the major surfaces of an aluminum nitride substrate having a thermal conductivity of 170 W/m K and a thickness of 0.8 mm by an active metal bonding method. The resultant structure was etched to form a pattern. When the bending strength of each aluminum nitride circuit board obtained as described above was measured, a bending strength of 300 MPa was obtained. When a heat cycle test (233K-RT-398K) was performed to the ceramic circuit board, cracks were formed after 500 cycles were performed, and a withstand voltage decreased.

As described above, according to a composite silicon nitride circuit board according to this embodiment, the mechanical strength of the overall circuit board can be increased without largely decreasing the original characteristics such as high thermal conductivity of the aluminum nitride substrate. For this reason, reliability can be considerably improved.

A high thermal conductive silicon nitride substrate is arranged at a portion which especially requires structural strength, while an aluminum nitride is arranged at a portion requires high thermal conductivity to mount a heat-generating part such as a semiconductor element. Both the substrates are arranged on the same plane or stacked on each other. For this reason, since heat generated by the heat-generating part such as a semiconductor element is rapidly transmitted out of the system through the aluminum nitride substrate having high thermal conductivity, heat radiation characteristics are very preferable.

On the other hand, since the silicon nitride substrate having high strength and high tenacity is arranged at a portion which requires structural strength, the maximum deflection of the circuit board can be assured to be large. For this reason, clamping cracks in the circuit board are not formed in the assembly step, and a semiconductor device using the circuit board can be mass-produced at a high production yield.

Industrial Applicability

As has been described above, a silicon nitride circuit board according to the present invention is formed such that a metal circuit plate is integrally bonded to the surface of high thermal conductive silicon nitride substrate having high-strength and high-tenacity characteristics which are original characteristics of a silicon nitride sintered body, and thermal conductivity which is considerably improved. Therefore, since the tenacity of the circuit board is high, the maximum deflection and anti-breaking strength can be assured to be large. For this reason, clamping cracks in the circuit board are not formed in the assembly step, and a semiconductor device using the circuit board can be mass-produced at a high production yield.

Since the tenacity and toughness of the silicon nitride substrate is high, cracks are rarely formed in the substrate by a heat cycle, heat cycle resistance characteristics are remarkably improved. Therefore, a semiconductor device which is excellent in durability and reliability can be provided.

In addition, since the silicon nitride substrate having a high thermal conductivity is used, even if semiconductor elements having a tendency toward high output and high integration density are mounted on the circuit board, the heat resistance characteristics are significantly degraded, and excellent heat radiation characteristics can be obtained.

In particular, since the silicon nitride substrate itself has excellent mechanical strength, when required mechanical strength characteristics are kept constant, the thickness of the substrate can be reduced in comparison with a case wherein another ceramic substrate is used. Since the substrate thickness can be reduced, a heat resistance can be decreased, and heat radiation characteristics can be further improved. A substrate having a thickness smaller than that of a conventional substrate can sufficiently cope with the required mechanical characteristics. For this reason, high-density packaging of the circuit board can be performed, and a semiconductor device can be decreased in size.

What is claimed is:

1. A silicon nitride circuit board comprising:

a high thermal conductive silicon nitride substrate having a thermal conductivity of not less than 60 W/m K; and a metal circuit plate bonded to said high thermal conductive silicon nitride substrate, wherein a thickness $D_s$ of said high thermal conductive silicon nitride substrate and a thickness $D_M$ of said metal circuit plate satisfy a relational formula $D_s \leq 2D_M$.

2. A silicon nitride circuit board according to claim 1, wherein the thickness $D_s$ of said high thermal conductive silicon nitride substrate and the thickness $D_M$ of said metal circuit plate satisfy a relational formula $D_M \leq D_s \leq (5/3)D_M$.

3. A silicon nitride circuit board according to claim 1, wherein said metal circuit plate is bonded to said high thermal conductive silicon nitride substrate through a metal bonding layer containing at least one active metal selected from the group consisting of Ti, Zr, Hf and Nb.

4. A silicon nitride circuit board according to claim 1, wherein said metal circuit plate is directly bonded to said high thermal conductive silicon nitride substrate through an oxide layer.

5. A silicon nitride circuit board according to any one of claim 1, wherein said high thermal conductive silicon nitride substrate consists of a silicon nitride sintered body containing 2.0 to 17.5 wt % of a rare earth element as an oxide and a total of not more than 0.3 wt % of Li, Na, K, Fe, Ca, Mg, Sr, Ba, Mn and B as impurity cation elements, constituted by a silicon nitride crystal phase and a grain boundary phase, and having a ratio of a crystallized compound phase to the overall grain boundary phase which is not less than 20%.

* * * * *